US008072261B2

(12) United States Patent
Yamanouchi et al.

(10) Patent No.: US 8,072,261 B2
(45) Date of Patent: Dec. 6, 2011

(54) POWER AMPLIFIER

(75) Inventors: Shingo Yamanouchi, Tokyo (JP);
Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 12/520,276

(22) PCT Filed: Dec. 13, 2007

(86) PCT No.: PCT/JP2007/074011
§ 371 (c)(1),
(2), (4) Date: Jun. 19, 2009

(87) PCT Pub. No.: WO2008/078565

PCT Pub. Date: Jul. 3, 2008

(65) Prior Publication Data
US 2009/0315620 A1   Dec. 24, 2009

(30) Foreign Application Priority Data

Dec. 26, 2006  (JP) ................................ 2006-349724
Nov. 30, 2007  (JP) ................................ 2007-310899

(51) Int. Cl.
*H03F 1/02*     (2006.01)
(52) U.S. Cl. ................. 330/9; 330/10; 330/136
(58) Field of Classification Search ............ 330/10, 330/136; 455/108
See application file for complete search history.

(56) References Cited

U.S. PATENT DOCUMENTS

| 6,191,653 | B1 | 2/2001 | Camp, Jr. et al. |
| 6,256,482 | B1* | 7/2001 | Raab ............................ 455/108 |
| 6,975,166 | B2 | 12/2005 | Grillo et al. |
| 7,366,482 | B2 | 4/2008 | Hara et al. |
| 2005/0151586 | A1 | 7/2005 | Grillo et al. |
| 2005/0245214 | A1 | 11/2005 | Nakamura et al. |
| 2006/0092326 | A1 | 5/2006 | Tanabe |

FOREIGN PATENT DOCUMENTS

| JP | 2002-530917 A | 9/2002 |
| JP | 2005-117315 A | 4/2005 |
| JP | 2005-513943 A | 5/2005 |
| JP | 2005-244950 A | 9/2005 |
| JP | 2005-269440 A | 9/2005 |
| JP | 2005-295523 A | 10/2005 |
| JP | 2006-093872 A | 4/2006 |
| JP | 2006-135422 A | 5/2006 |

* cited by examiner

*Primary Examiner* — Robert Pascal
*Assistant Examiner* — Khiem Nguyen
(74) *Attorney, Agent, or Firm* — Dickstein Shapiro LLP

(57) ABSTRACT

A power amplifier based on EER technology or ET technology extracts an amplitude-modulated component from a modulated signal as an input signal which includes the amplitude-modulated component and a phase-modulated component, and decomposes the amplitude-modulated component into two control signals whose product is proportional to the amplitude-modulated component. One of the control signals is amplified by a highly efficient amplifier, and thereafter is used to amplitude-modulate an output from an RF amplifier. The other control signal is converted by a pulse modulator into a rectangular-wave signal, which is then mixed with the phase-modulated component or the modulated signal and input to the RF amplifier.

21 Claims, 26 Drawing Sheets

POWER AMPLIFIER

TECHNICAL FIELD

The present invention relates to a power amplifier with high linearity and power efficiency, primarily for use in wireless communication devices.

BACKGROUND ART

Power amplifiers for transmission which are included in wireless communication devices consume much electric power among other components in the wireless communication devices. Therefore, improving the power efficiency of power amplifiers is an important task to be accomplished in the development of wireless communication devices. In recent years, the wireless communication standards have seen mainstream efforts directed to an amplitude modulation scheme for improving the spectral efficiency. According to the amplitude modulation scheme, since strict requirements are imposed on signal distortions, power amplifiers need to be operated in a high backoff (low input power) state for better linearity. However, if a power amplifier is operated in the high backoff state, then the power amplifier has its power efficiency lowered. Recently, EER (Envelope Elimination and Restoration) has been intensively researched as a technology for increasing the power efficiency of power amplifiers and keeping linearity between input and output signals.

The EER technology is a scheme for amplifying highly efficiently an input signal (modulated signal) including an amplitude-modulated (AM) component and a phase-modulated (PM) component. Specifically, only the PM component that is left by removing the AM component from the input signal is amplified, and the amplified PM component is amplitude-modulated with the removed AM component, thereby linearly amplifying the input signal and restoring the original waveform thereof. FIG. 1 shows a configuration of a power amplifier according to the background art which is based on the EER technology.

FIG. 1 is a block diagram showing the configuration of the power amplifier according to the background art which is based on the EER technology.

As shown in FIG. 1, the power amplifier according to the background art which is based on the EER technology comprises signal generating circuit 147, RF (Radio Frequency) amplifier 109, pulse modulator 104, driver amplifier 116, switching amplifier 105, low-pass filter 106, and bandpass filter 107.

Signal generating circuit 147 extracts an AM component included in an input signal, and outputs the extracted AM component as amplitude component signal 111 through terminal 145 to pulse modulator 104. Signal generating circuit 147 also extracts a PM component included in the input signal, and outputs the extracted PM component as phase component signal 112 through terminal 146 to RF amplifier 109.

Pulse modulator 104 pulse-modulates amplitude component signal 111 to generate a rectangular-wave signal, and outputs the rectangular-wave signal to driver amplifier 116.

According to the rectangular-wave signal output from pulse modulator 104, driver amplifier 116 drives switching amplifier 105 to amplify the rectangular-wave signal efficiently. The amplified rectangular-wave signal is smoothed by low-pass filter 106, and then supplied through terminal 142 to RF amplifier 109.

RF amplifier 109 comprises transistor 101, input power supply circuit 108, and output power supply circuit 140. RF amplifier 109 amplifies phase component signal 112 output from signal generating circuit 147. An output signal from RF amplifier 109 is amplitude-modulated with the smoothed rectangular-wave signal supplied from switching amplifier 105 through low-pass filter 106 and terminal 142, i.e., amplified amplitude component signal 114.

Input power supply circuit 108 that is connected to the gate of transistor 101 is usually supplied with a constant DC voltage from a power supply device, not shown, through terminal 141.

The signal amplified by RF amplifier 109 (output signal 115) is processed by bandpass filter 107 to remove unwanted band components therefrom, and then supplied through terminal 144 to an antenna device, not shown, or the like.

FIG. 2 is a block diagram showing a configurational example of the signal generating circuit shown in FIG. 1, and FIG. 3 is a block diagram showing another configurational example of the signal generating circuit shown in FIG. 1. Signal generating circuit 147 shown in FIG. 2 is of a configuration optimum for an application wherein an RF signal is input to input terminal 143 of the power amplifier, and signal generating circuit 147 shown in FIG. 3 is of a configuration that is optimum for an application wherein a baseband signal is input to input terminal 143 of the power amplifier.

Signal generating circuit 147 shown in FIG. 2 comprises amplitude detector 103 for extracting an AM component from an RF signal as an input signal and outputting the extracted AM component as amplitude component signal 111, and limiter 102 for removing the AM component of the input signal. Amplitude detector 103 extracts the AM component of the input signal (RF signal) input from terminal 143, and outputs the extracted AM component as amplitude component signal 111 from terminal 145. Limiter 102 removes the AM component of the input signal (RF signal) input from terminal 143, and outputs phase component signal 112, which represents a remaining PM component, from terminal 146. Signal generating circuit 147 shown in FIG. 2 also includes delay corrector 153 which is capable of adjusting the delay time difference between amplitude component signal 111 and phase component signal 112.

Signal generating circuit 147 shown in FIG. 3 comprises baseband signal processing circuit 150 and VCO 151. Baseband signal processing circuit 150 should preferably comprise a DSP (Digital Signal Processor) and a D/A (digital-to-analog) converter. Baseband signal processing circuit 150 outputs amplitude component signal 111, which represents the AM component of the baseband signal as the input signal, to terminal 145, and also outputs a phase component signal, which represents the PM component of the baseband signal, to VCO 151. In baseband signal processing circuit 150, the DSP calculates and extracts the AM component of the baseband signal input from terminal 143 according to a digital processing process, and the D/A converter converts the AM component into an analog signal and thereafter outputs the analog signal as amplitude component signal 111 from terminal 145. Furthermore, the DSP calculates and extracts the PM component of the baseband signal input from terminal 143 according to a digital processing process, and the D/A converter converts the PM component into an analog signal and thereafter outputs the analog signal as a phase component signal from terminal 145. Baseband signal processing circuit 150 controls VCO 151 with the same phase component signal.

VCO 151 is controlled by the phase component signal from baseband signal processing circuit 150 to output a phase component signal which has been up-converted into an RF signal.

With the power amplifier shown in FIG. 1, signal generating circuit 147 outputs phase component signal 112 with sufficiently large electric power to keep transistor 101 of RF amplifier 109 saturated state in operation at all times. The drain of transistor 101 of RF amplifier 109 is supplied with amplitude component signal 114 through terminal 142 and output power supply circuit 140 to amplitude-modulate phase component signal 112 amplified by transistor 101 with amplitude component signal 114. Therefore, the power amplifier can amplify the input signal with high power efficiency and maintain linearity between the input and output signals.

On the other hand, ET (Envelope Tracking) is known as another technology for increasing the power efficiency of power amplifiers and keeping linearity between input and output signals.

The ET technology is a scheme for amplifying an input signal including an AM component and a PM component, extracting the AM component of the input signal, and amplitude-modulating the amplified signal with the extracted AM component for thereby increasing the power efficiency and keeping linearity between input and output signals. FIG. 4 shows the configuration of a power amplifier according to the background art which is based on the ET technology.

FIG. 4 is a block diagram showing the configuration of the power amplifier according to the background art which is based on the ET technology.

As shown in FIG. 4, the power amplifier according to the background art which is based on the ET technology is different from the power amplifier based on the EER technology shown in FIG. 1 as to configurational and operational details of signal generating circuit 148. The configurational and operational details of the other components are the same as those of the power amplifier based on the EER technology shown in FIG. 1 and will not be described below. In FIG. 4, components other than signal generating circuit 148 are denoted by the same reference characters as those of the power amplifier shown in FIG. 1.

Signal generating circuit 148 extracts an AM component included in an input signal, and outputs the extracted AM component as amplitude component signal 111 through terminal 145 to pulse modulator 104. Signal generating circuit 148 outputs modulated signal 149 that is proportional to the amplitude of the input signal which includes the AM component and a PM component, through terminal 146 to RF amplifier 109.

FIG. 5 is a block diagram showing a configurational example of the signal generating circuit shown in FIG. 4, and FIG. 3 is a block diagram showing another configurational example of the signal generating circuit shown in FIG. 4. Signal generating circuit 148 shown in FIG. 5 is of a configuration that is optimum for an application wherein an RF signal is input to input terminal 143 of the power amplifier, and the signal generating circuit shown in FIG. 6 is of a configuration that is optimum for an application wherein a baseband signal is input to input terminal 143 of the power amplifier.

Signal generating circuit 148 shown in FIG. 5 comprises amplitude detector 103 for extracting an AM component from an RF signal as an input signal and for outputting the extracted AM component as amplitude component signal 111. Amplitude detector 103 extracts the AM component of the input signal (RF signal) input from terminal 143, and outputs the extracted AM component as amplitude component signal 111 from terminal 145. The input signal input from terminal 143 is supplied to amplitude detector 103 and is also output as modulated signal 149 from terminal 146. Signal generating circuit 148 shown in FIG. 5 also includes delay corrector 153 which is capable of adjusting the delay time difference between amplitude component signal 111 and modulated signal 149.

Signal generating circuit 148 shown in FIG. 6 comprises baseband signal processing circuit 150 and quadrature modulator 152. In baseband signal processing circuit 150, the DSP calculates and extracts the AM component of the baseband signal input from terminal 143 according to a digital processing process, and the D/A converter converts the AM component into an analog signal and thereafter outputs the analog signal as amplitude component signal 111 from terminal 145. Furthermore, the D/A converter converts the input baseband signal into an analog signal and thereafter outputs the analog signal to quadrature modulator 152.

Quadrature modulator 152 up-converts the baseband signal output from baseband signal processing circuit 150 into an RF frequency signal, and outputs the RF frequency signal as modulated signal 149 from terminal 146.

With the power amplifier shown in FIG. 4, signal generating circuit 148 outputs modulated signal 149 with sufficiently large electric power to keep transistor 101 of RF amplifier 109 saturated state in operation at all times, thereby enabling RF amplifier 109 to have the function of limiter 102 shown in FIG. 2. Specifically, the power amplifiers based on the EER technology and the ET technology operate according to common principles except that the PM component of the input signal is input to RF amplifier 109 according to the EER technology and modulated signal 149 including the AM component and the PM component is input to RF amplifier 109 according to the ET technology. Therefore, the power amplifier based on the ET technology can also amplify the input signal with high power efficiency and maintain linearity between the input and output signals.

If the power amplifier shown in FIG. 1 or FIG. 4 is employed to power-amplify an RF signal having a bandwidth of several MHz such as those used in the W-CDMA (Wideband Code Division Multiple Access) communication process, then driver amplifier 116 and switching amplifier 105 need to perform a switching operation in a frequency range from several tens to several hundreds MHz. Furthermore, if the EER technology and the ET technology are applied to power amplifiers provided in radio base stations, then it is necessary for switching amplifier 105 to output a high voltage of several tens of volts. According to the present device and circuit technologies, however, driver amplifier 116 and switching amplifier 105 that operate under a high voltage of several tens of volts have a switching rate that is limited to about several hundreds kHz at maximum. A scheme for avoiding such an operational limitation on driver amplifier 116 and switching amplifier 105 has been proposed by JP-A No. 2005-244950, for example.

FIG. 7 is a block diagram showing another configurational example of the power amplifier according to the background art which is based on the EER technology. The power amplifier shown in FIG. 7 is illustrated in FIG. 24 of JP-A No. 2005-244950.

Data generator 301 shown in FIG. 7 outputs an amplitude component signal and a phase component signal of a transmission signal. The phase component signal is added to an RF signal by angle modulator 303 and output to amplitude modulator 305. The amplitude component signal is decomposed into a low-frequency amplitude component signal and a high-frequency amplitude component signal by frequency discriminator 302. Amplitude modulator 305 amplitude-modulates the phase component signal with a high-frequency amplitude component signal generated by high-frequency voltage controller 304, and amplitude modulator 307 amplitude-modulates the phase component signal with a low-frequency amplitude component signal generated by low-frequency voltage controller 306. According to this arrangement, high-frequency voltage controller 304 may have relatively small output power though the operating frequency thereof is high, and low-frequency voltage controller 306 may have a relatively low operating frequency though the output power thereof is large. Therefore, high-frequency voltage controller 304 and low-frequency voltage controller 306 shown in FIG. 7 do not need to have both high-voltage output and fast switching operation, but may be realized by the present device and circuit technologies.

However, the above power amplifiers according to the background art are problematic in that the power efficiency of RF amplifier 109 shown in FIGS. 1 and 4 is lowered when the voltage (power supply voltage) supplied to output power supply circuit 140 of RF amplifier 109 is lowered. FIG. 8 shows power efficiency characteristics when the RF amplifier 109 shown in FIG. 1 is supplied with a constant power supply voltage (when it is in conventional operation), and also shows power efficiency characteristics when the RF amplifier 109 shown in FIG. 1 is in EER operation.

As shown in FIG. 8, RF amplifier 109 has its power efficiency made better when it is in EER operation than when it is in conventional operation. However, even when RF amplifier 109 is in EER operation, the power efficiency thereof is low at the time that the output power thereof is small. The reduction in the power efficiency of RF amplifier 109 at the time that the output power thereof is small is responsible to a reduction in the average power efficiency of the overall power amplifying circuit.

The power amplifiers according to the background art are also disadvantageous in that the power efficiency of switching amplifier 105 shown in FIGS. 1 and 4 is lowered when the output voltage (average voltage) of switching amplifiers 105 is lowered. As with the reduction in the power efficiency of RF amplifier 109 described above, the reduction in the power efficiency of switching amplifier 105 is responsible for a reduction in the average power efficiency of the overall power amplifying circuit.

Specifically, in the case where the amplitude component of the input signal has a large dynamic range and the output power of the power amplifier is small, the power efficiency of the RF amplifier and the switching amplifier of the power amplifiers according to the background art based on the EER technology and the ET technology is lowered and cannot be sufficiently improved.

Furthermore, if the power amplifiers according to the background art shown in FIGS. 1 and 4 are employed to power-amplify an RF signal having a wide bandwidth, then driver amplifier 116 and switching amplifier 105 needs to have both high-voltage output and a fast switching operation. However, such requirements cannot be met by the present device technologies. Accordingly, the power amplifiers shown in FIGS. 1 and 4 have a limited range of applications.

The power amplifier shown in FIG. 7 does not require driver amplifier 116 and switching amplifier 105 to have both high-voltage output and fast switching operation. However, the arrangement has a problem in that a signal representative of the input signal which is highly accurately restored cannot be produced as the output signal.

According to the arrangement shown in FIG. 7, when amplitude modulator 307 is saturated state in operation, the output amplitude of amplitude modulator 307 is nearly independent of the output amplitude of amplitude modulator 305. Therefore, the output signal of amplitude modulator 307 does not reflect the amplitude of the high-frequency amplitude component signal generated by high-frequency voltage controller 304. Conversely, when amplitude modulator 307 is linearly operated, the output amplitude of amplitude modulator 307 is virtually unchanged by the low-frequency amplitude component signal generated by low-frequency voltage controller 306. Therefore, the output signal of amplitude modulator 307 does not reflect the amplitude of the low-frequency amplitude component signal generated by low-frequency voltage controller 306. Consequently, since the output signal reflects only either the amplitude component signals generated by high-frequency voltage controller 304 or low-frequency voltage controller 306, it is difficult to produce a signal representative of the input signal which is highly accurately restored, as the output signal.

SUMMARY

It is an object of the present invention to provide a power amplifier based on the EER technology and the ET technology which is capable of amplifying a signal with good power efficiency and accurately restoring the signal.

To achieve the above object, there is provided in accordance with the present invention a power amplifier for amplifying a modulated signal including an amplitude-modulated component and a phase-modulated component, comprising:

a decomposing circuit for decomposing said amplitude-modulated component into two control signals whose product is proportional to said amplitude-modulated component;

a mixing circuit for mixing one of the decomposed control signals with said phase-modulated component;

an amplifying circuit for amplifying the other of the decomposed control signals; and an RF amplifier for amplifying a signal output from said mixing circuit, amplitude-modulating the amplified signal with an output signal from said amplifying circuit, and outputting the amplitude-modulated signal.

There is also provided a power amplifier for amplifying a modulated signal including an amplitude-modulated component and a phase-modulated component, comprising:

a decomposing circuit for decomposing said amplitude-modulated component into two control signals whose product is proportional to said amplitude-modulated component;

a mixing circuit for mixing one of the decomposed control signals with said modulated signal;

an amplifying circuit for amplifying the other of the decomposed control signals; and an RF amplifier for amplifying a signal output from said mixing circuit, amplitude-modulating the amplified signal with an output signal from said amplifying circuit, and outputting the amplitude-modulated signal.

EXEMPLARY EMBODIMENT

The present invention will be described below with reference to the drawings.

Figure 9:
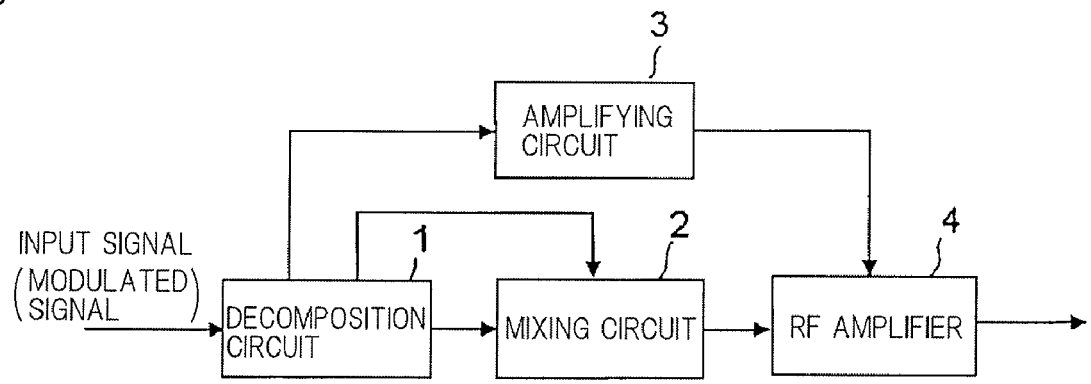
FIG. 9 is a block diagram showing a configurational example of a power amplifier according to the present invention.

FIG. 9 is a block diagram showing a configurational example of a power amplifier according to the present invention.

As shown in FIG. 9, the power amplifier according to the present invention comprises decomposition circuit 1, mixing circuit 2, amplifying circuit 3, and RF amplifier 4.

Decomposition circuit 1 decomposes an AM component included in an input signal into two control signals whose product has a value proportional to the AM component.

If the EER technology described above is applied, then mixing circuit 2 mixes one of the control signals decomposed by decomposition circuit 1 with a PM component included in the input signal. If the ET technology described above is applied, then mixing circuit 2 mixes one of the control signals decomposed by decomposition circuit 1 with the input signal (modulated signal).

Amplifying circuit 3 amplifies the other control signal decomposed by decomposition circuit 1, and outputs the amplified control signal to RF amplifier 4.

RF amplifier 4 amplifies a signal output from mixing circuit 2, amplitude-modulates the amplified signal with the output signal from amplifying circuit 3, and outputs the amplitude-modulated signal.

Specific examples of decomposition circuit 1, mixing circuit 2, amplifying circuit 3, and RF amplifier 4 of the power amplifier shown in FIG. 9 will be described below based on the first through fourth exemplary embodiments.

First Exemplary Embodiment

Figure 10:
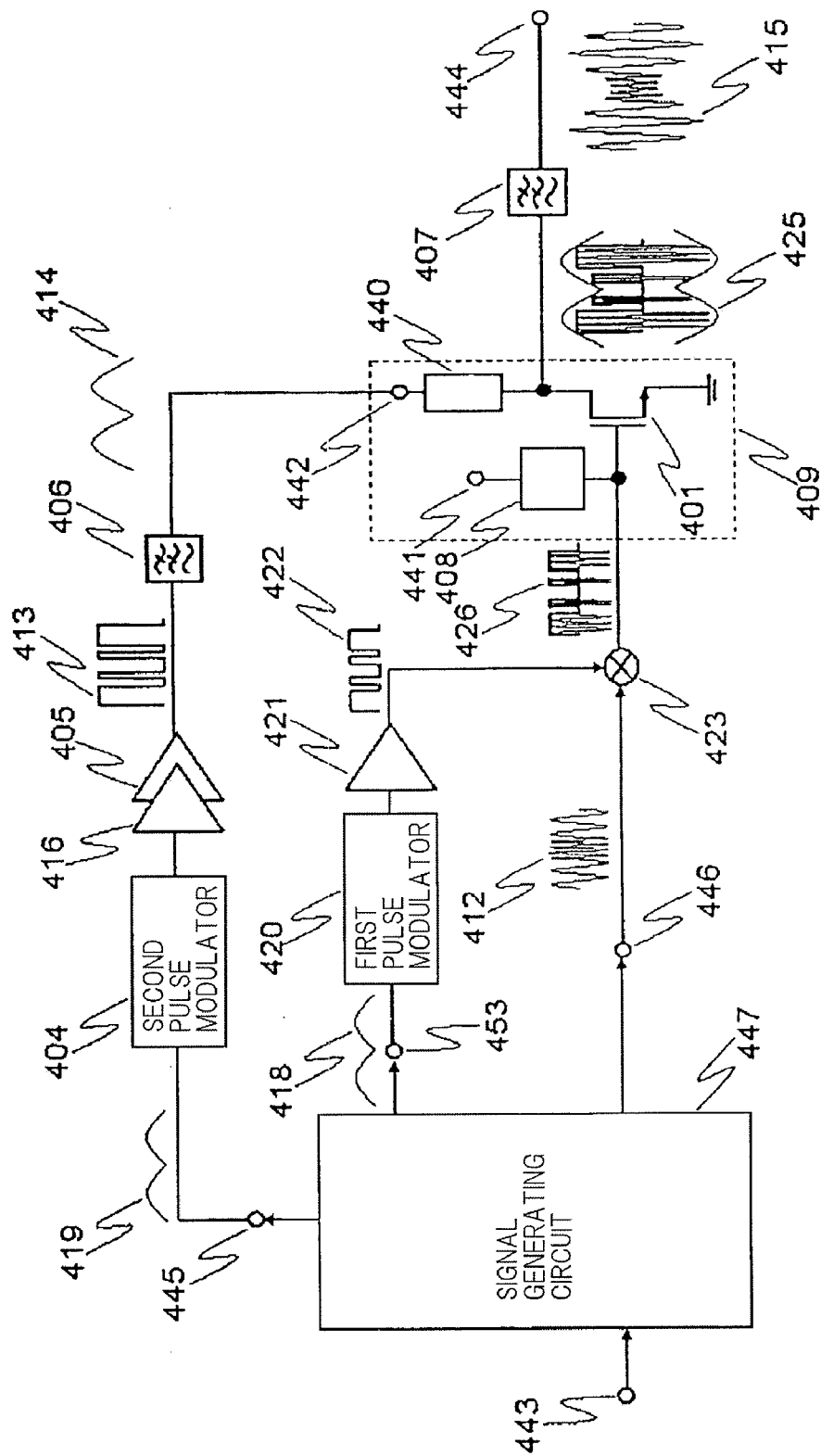
FIG. 10 is a block diagram showing a configuration of a power amplifier according to a first exemplary embodiment.
Figure 11:
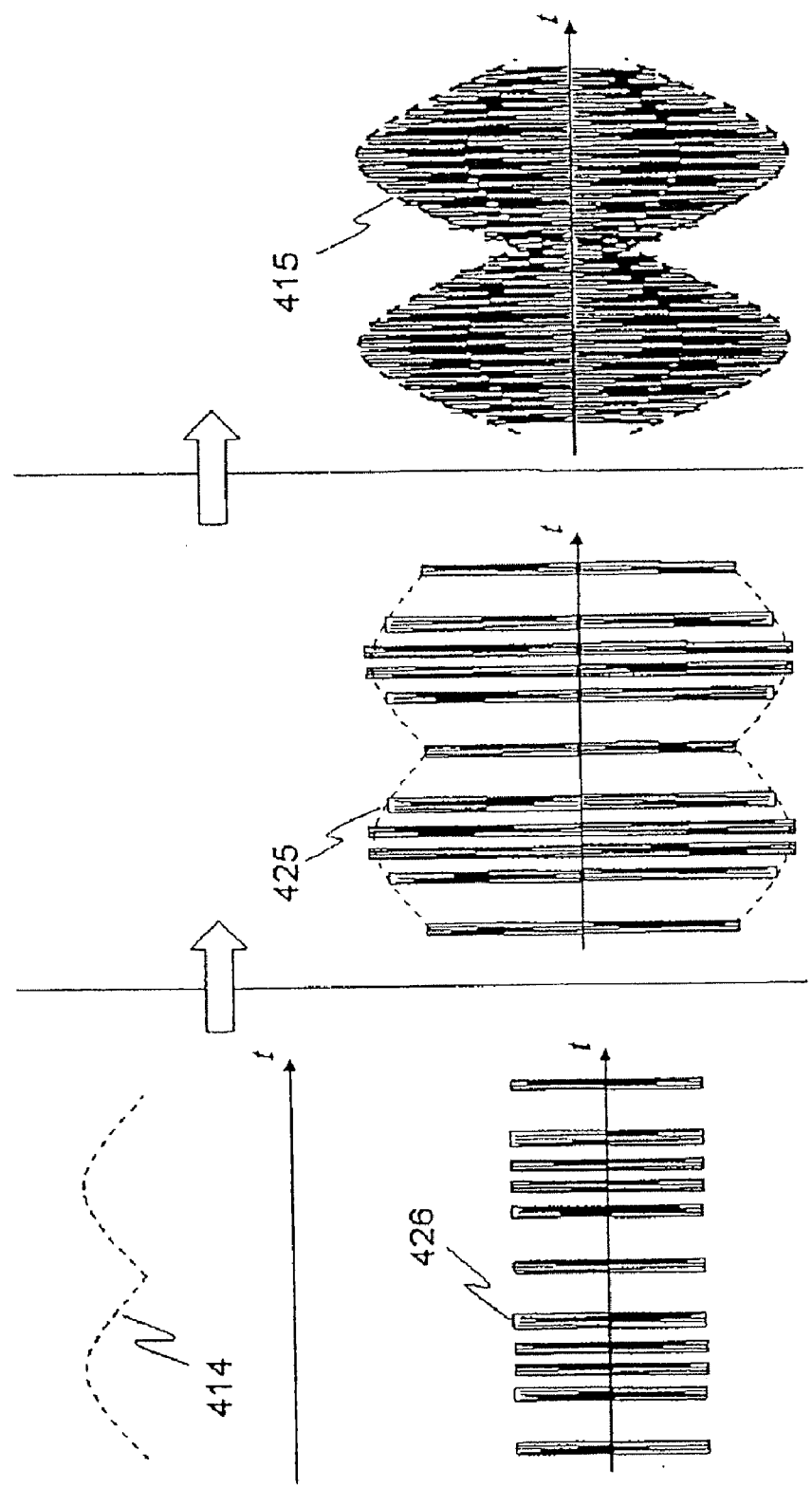
FIG. 11 is a waveform diagram showing signal waveforms in principal portions of the power amplifier shown in FIG. 10.
Figure 12:
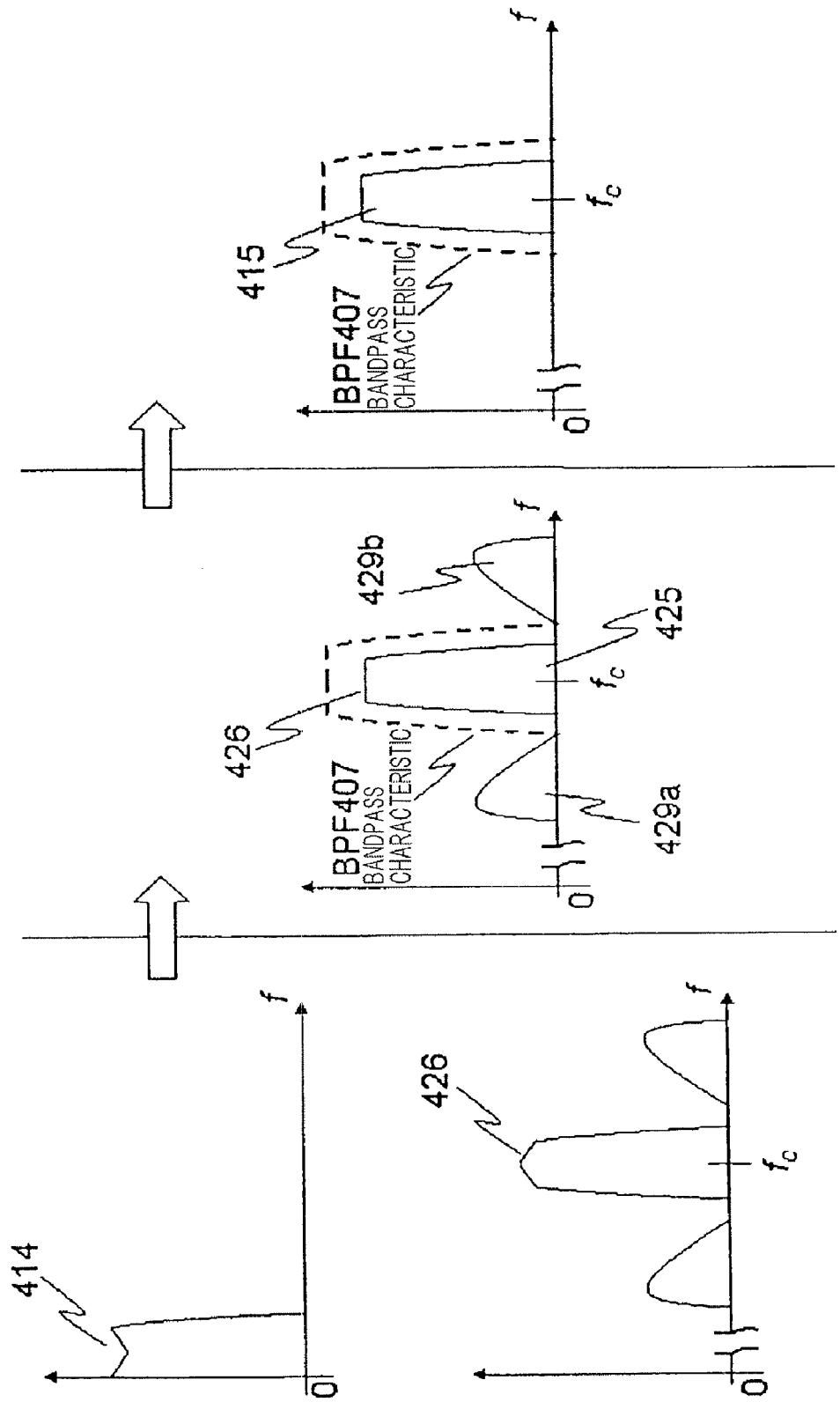
FIG. 12 is a graph showing the frequency characteristics of the signals shown in FIG. 11.

FIG. 10 is a block diagram showing a configuration of a power amplifier according to a first exemplary embodiment. FIG. 11 is a waveform diagram showing signal waveforms in principal portions of the power amplifier shown in FIG. 10. FIG. 12 is a graph showing the frequency characteristics of the signals shown in FIG. 11. FIG. 10 shows a configurational example of the power amplifier based on the EER technology described above.

As shown in FIG. 10, the power amplifier according to the first exemplary embodiment comprises signal generating circuit 447, RF (Radio Frequency) amplifier 409, first pulse modulator 420, first driver amplifier 421, second pulse modulator 404, second driver amplifier 416, switching amplifier 405, low-pass filter 406, mixer 423, and bandpass filter 407

Decomposition circuit 1 shown in FIG. 9 is included in signal generating circuit 447 shown in FIG. 10 (a signal separator or a signal generator to be described later). Mixing circuit 2 shown in FIG. 9 corresponds to mixer 423 shown in FIG. 10. RF amplifier 4 shown in FIG. 9 corresponds to RF amplifier 409 shown in FIG. 10. Amplifying circuit 3 shown in FIG. 9 is made up of second pulse modulator 404, second driver amplifier 416, switching amplifier 405, and low-pass filter 406 shown in FIG. 10.

Signal generating circuit 447 extracts an AM component included in an input signal, outputs first control signal 418 generated from the AM component through terminal 453 to first pulse modulator 420, and outputs second control signal 419 generated from the AM component through terminal 445 to second pulse modulator 404. In the present exemplary embodiment, if it is assumed that the AM component of the input signal is denoted by a(t), then signal generating circuit 447 outputs amplitude component $a_1(t)$, which has a smaller dynamic range than AM component a(t) and satisfies the relationship: a(t) proportional to $a_1(t)$ $a_2(t)$, as first control signal 418 to first pulse modulator 420, and also outputs amplitude component $a_2(t)$ as second control signal 419 to second pulse modulator 404. Signal generating circuit 447 also extracts a PM component included in the input signal, and outputs the extracted PM component as phase component signal 412 through terminal 446 to RF amplifier 409. Signal generating circuit 447 should preferably have a function to adjust the delay time difference between first control signal 418 and phase component signal 412 and the delay time difference between second control signal 419 and phase component signal 412.

First pulse modulator 420 pulse-modulates first control signal 418 to generate a rectangular-wave signal having a constant amplitude, and outputs the rectangular-wave signal to first driver amplifier 421. First pulse modulator 420 may comprise a PWM (Pulse Width Modulation) modulator, a delta modulator, a delta-sigma modulator, or the like. First pulse modulator 420 may comprise any circuit insofar as it can convert first control signal 418 output from signal generating circuit 447 into a rectangular-wave signal having a constant amplitude.

First driver amplifier 421 amplifies the rectangular-wave signal output from first pulse modulator 420 and supplies the amplified rectangular-wave signal to mixer 423. If first pulse modulator 420 is capable of outputting a signal which is intensive enough to drive mixer 423, then first driver amplifier 421 may be dispensed with.

Second pulse modulator 404 pulse-modulates second control signal 419 to generate a rectangular-wave signal, and outputs the rectangular-wave signal to second driver amplifier 416. Second pulse modulator 404 may comprise a PWM (Pulse Width Modulation) modulator, a delta modulator, a delta-sigma modulator, or the like, as with first pulse modulator 420.

Second pulse modulator 416 drives switching amplifier 405 according to the rectangular-wave signal output from second pulse modulator 404, and switching amplifier 405 current-amplifies the rectangular-wave signal efficiently. The amplified rectangular-wave signal is smoothed by low-pass filter 406, and supplied through terminal 442 to RF amplifier 409. Switching amplifier 405 may comprise an amplifier capable of amplifying the rectangular-wave signal with high power efficiency, e.g., a class-D amplifier, a class-E amplifier, a class-S amplifier, or the like. If second pulse modulator 404 is capable of outputting a signal which is intensive enough to drive switching amplifier 405, then second driver amplifier 416 may be dispensed with.

Mixer 423 mixes the phase component signal output from signal generating circuit 447 with the rectangular-wave signal output from first driver amplifier 421, and outputs the mixed signal to RF amplifier 409.

RF amplifier 409, which comprises transistor 401, input power supply circuit 408, and output power supply circuit 440, amplifies output signal 426 from mixer 423. At this time, the output signal from RF amplifier 409 is amplitude-amplified with the smoothed rectangular-wave signal supplied from switching amplifier 405 through low-pass filter 406 and terminal 442, i.e., amplified amplitude component signal 414. Input power supply circuit 408 that is connected to the gate of transistor 401 is supplied with a constant DC voltage from a power supply device, not shown, through terminal 441, as with the background art. Transistor 401 may be either a field-effect transistor or a bipolar transistor.

The output signal amplified by RF amplifier 409 (output signal 415) is processed by bandpass filter 407 to remove unwanted band components therefrom, and then supplied through terminal 444 to an antenna device, not shown, or the like.

Figure 13:
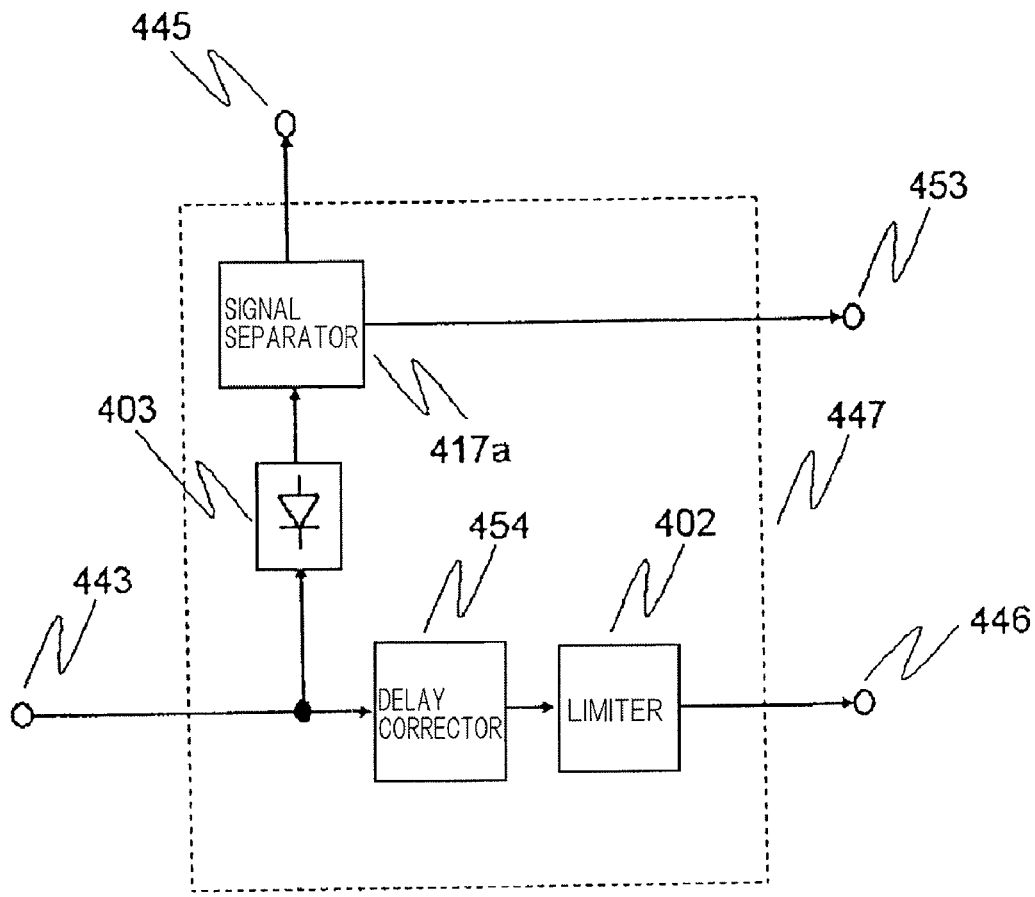
FIG. 13 is a block diagram showing a configurational example of a signal generating circuit shown in FIG. 10.
Figure 14:
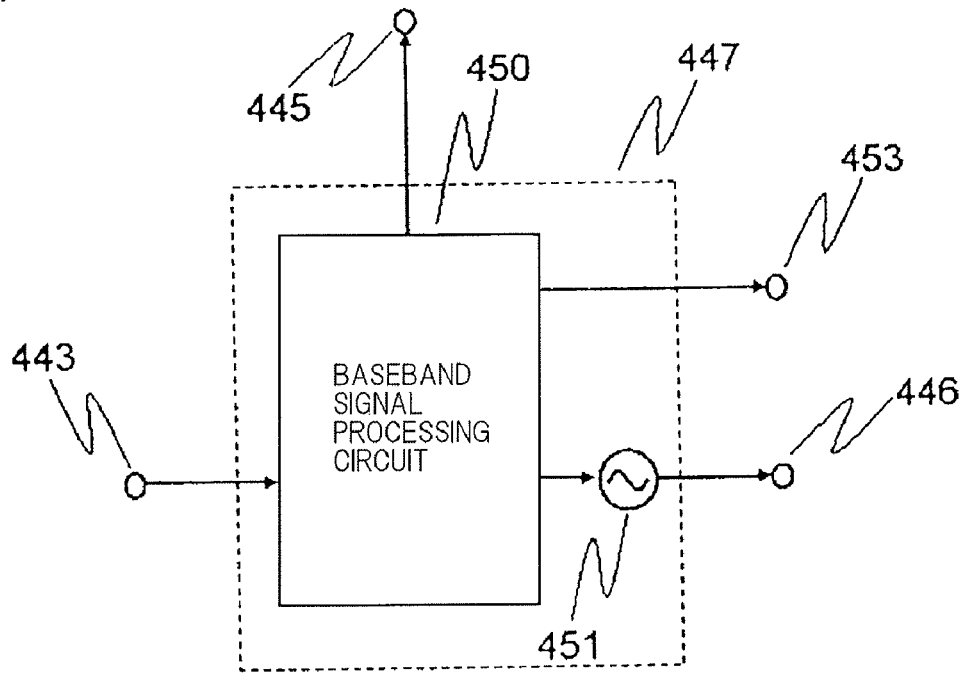
FIG. 14 is a block diagram showing another configurational example of the signal generating circuit shown in FIG. 10.

FIG. 13 is a block diagram showing a configurational example of the signal generating circuit shown in FIG. 10, and FIG. 14 is a block diagram showing another configurational example of the signal generating circuit shown in FIG. 10. Signal generating circuit 447 shown in FIG. 13 is of a configuration that is optimum for an application wherein an RF signal is input to the power amplifier shown in FIG. 10, and signal generating circuit 447 shown in FIG. 14 is of a configuration that is optimum for an application wherein a baseband signal is input to the power amplifier shown in FIG. 10.

Signal generating circuit 447 shown in FIG. 13 comprises amplitude detector 403 for extracting an AM component from an RF signal as an input signal, limiter 402 for removing the AM component of the input signal, and signal separator 417a for decomposing the AM component extracted from the input signal by amplitude detector 403. Signal generating circuit 447 shown in FIG. 13 also includes delay corrector 454 which is capable of adjusting the delay time difference between the AM component extracted from the input signal by amplitude detector 403 and a PM component extracted by limiter 402.

Amplitude detector 403 extracts the AM component of the input signal (RF signal) input from terminal 443, and outputs the extracted AM component to signal separator 417a. Signal separator 417a decomposes AM component a(t) of the input signal into amplitude components $a1(t)$, $a2(t)$ which satisfy the relationship: a(t) proportional to $a_1(t)$ $a_2(t)$, outputs first control signal 418 having amplitude component $a_1(t)$ to terminal 453, and outputs second control signal 419 having amplitude component $a_2(t)$ to terminal 445. Limiter 402 removes the AM component of the input signal (RF signal) input from terminal 443, and outputs phase component signal 412, which represents a remaining PM component, from terminal 446.

Signal separator 417a may be implemented by a digital signal processor (DSP) including logic circuits, an A/D (analog-to-digital) converter, and a D/A (digital-to-analog) converter, an arithmetic circuit comprising an analog circuit, or the like.

Signal generating circuit 447 shown in FIG. 14 comprises baseband signal processing circuit 450 and VCO 451. Baseband signal processing circuit 450 should preferably comprise a DSP and a D/A converter. In baseband signal processing circuit 450, the DSP calculates and extracts amplitude components $a_1(t)$, $a_2(t)$ which satisfy the relationship: a(t) proportional to $a_1(t)$ $a_2(t)$ from AM component a(t) of the baseband signal input from terminal 443 according to a digital processing process, and the D/A converter converts amplitude components $a_1(t)$, $a_2(t)$ into analog signals, and thereafter outputs amplitude component $a_1(t)$ as first control signal 418 to terminal 453 and outputs amplitude component $a_2(t)$ as second control signal 419 to terminal 445. Furthermore, the DSP calculates and extracts the PM component of the baseband signal input from terminal 443 according to a digital processing process, and the D/A converter converts the PM component into an analog signal and thereafter outputs the analog signal as a phase component signal from terminal 145. Baseband signal processing circuit 450 should preferably have a function, implemented by the DSP, to calculate and correct the delay time difference between the AM and PM components of the baseband signal.

VCO 451 is controlled by an output signal from baseband signal processing circuit 450 to output a phase component signal which has been up-converted into an RF signal.

In FIG. 10, signal generating circuit 447 has a D/A converter for outputting first control signal 418 and second control signal 419 as analog signals. However, if signal generating circuit 447 includes signal separator 417a comprising a DSP shown in FIG. 13 or baseband signal processing circuit 450 shown in FIG. 14, then signal generating circuit 447 may output first control signal 418 and second control signal 419 as digital signals. In this case, first pulse modulator 420 and second pulse modulator 404 may include respective D/A converters. Baseband signal processing circuit 450 and signal separator 417a of signal generating circuit 447 may include the functions of first pulse modulator 420 and second pulse modulator 404. In this case, first pulse modulator 420 and second pulse modulator 404 may be dispensed with.

With the power amplifier according to the first exemplary embodiment shown in FIG. 10, first control signal 418 is added to phase component signal 412 by mixer 423. Such a function may be realized by RF amplifier 478 shown in FIG. 15. The power amplifier shown in FIG. 15 is of a configuration wherein RF amplifier 4 of the power amplifier shown in FIG. 9 includes mixing circuit 2.

Figure 15:
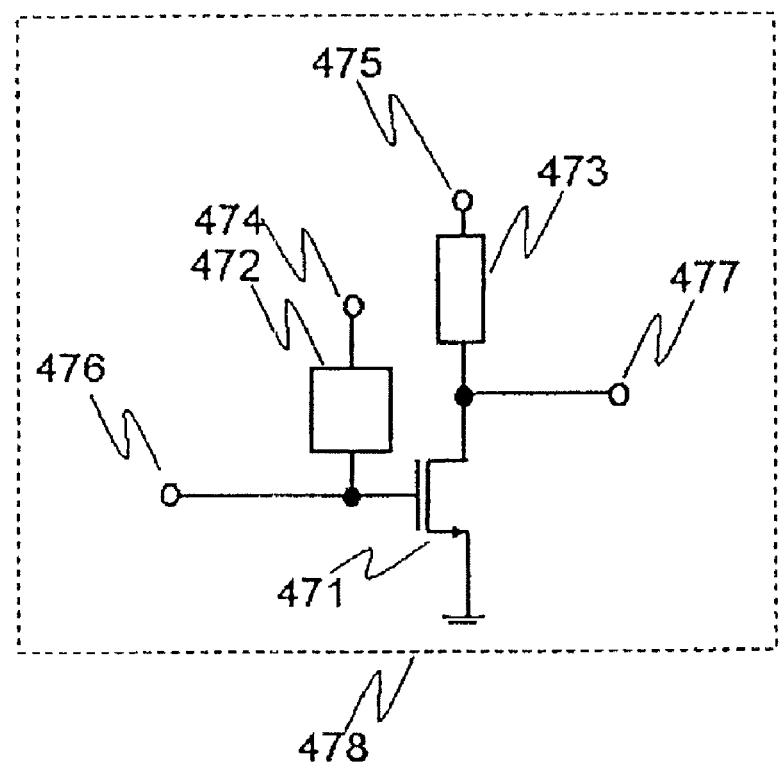
FIG. 15 is a circuit diagram showing a configuration of an RF amplifier which can be used in place of a mixer shown in FIG. 10.

RF amplifier 478 shown in FIG. 15 is of the same configuration as RF amplifier 409 shown in FIG. 10, and comprises transistor 471, input power supply circuit 472, and output power supply circuit 473.

If RF amplifier 478 shown in FIG. 15 is used in place of mixer 423, then phase component signal 412 may be input from terminal 476 shown in FIG. 15 and the rectangular-wave signal output from first driver amplifier 421 may be input to input power supply terminal 474 or to output power supply terminal 475 shown in FIG. 15. In this case, a signal representative of phase component signal 412 and the rectangular-wave signal that are mixed with each other is produced from terminal 477.

Since RF amplifier 409 shown in FIG. 10 provides high power efficiency when saturated state in operation, the input signal applied to RF amplifier 409 should desirably have electric power high enough to saturate RF amplifier 409 in operation. However, when RF amplifier 409 is saturated state in operation, the output signal of RF amplifier 409 does not reflect the amplitude component of the input signal of RF amplifier 409. Accordingly, first control signal 418 is converted into rectangular-wave signal 422 having a constant amplitude, and rectangular-wave signal 422 is added to phase component signal 412 by mixer 423 and then input to RF amplifier 409. By thus processing first control signal 418, it is possible for the output signal of RF amplifier 409 to reflect the amplitude component of first control signal 418.

Figure 1:
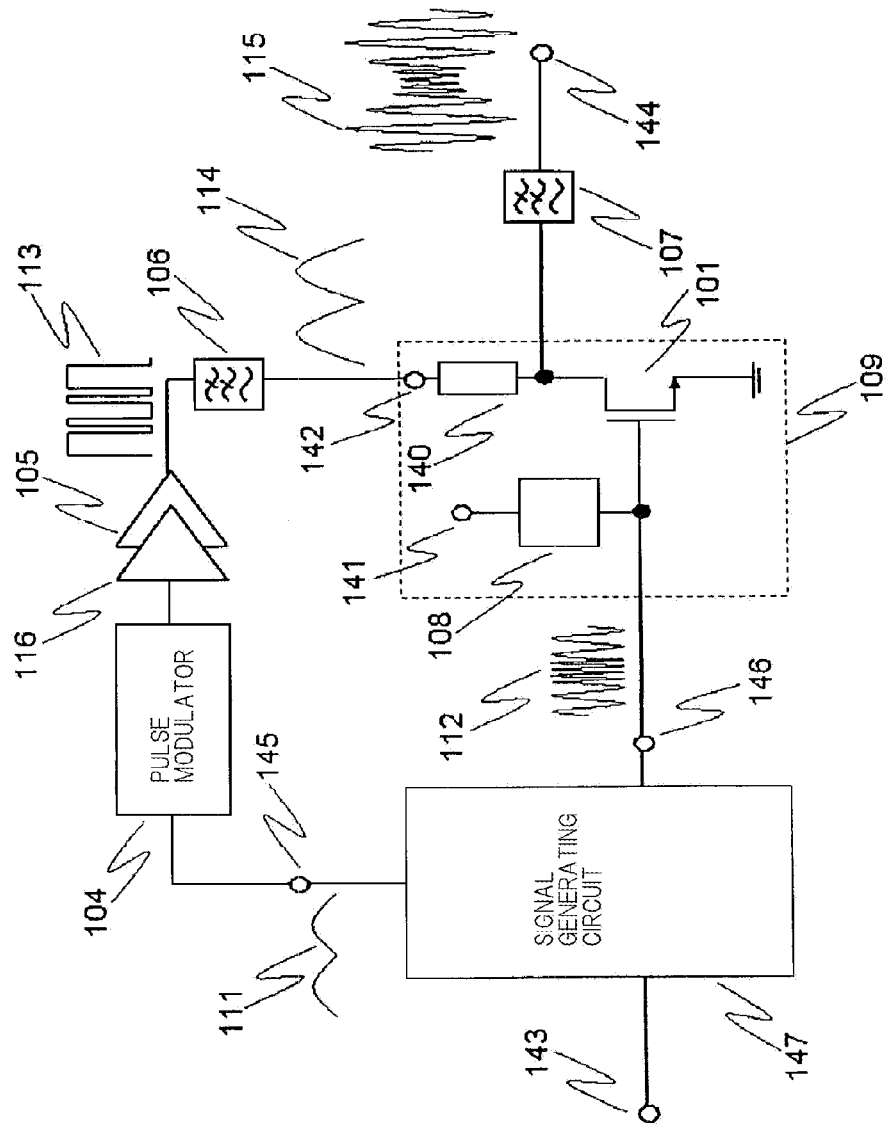
FIG. 1 is a block diagram showing a configuration of a power amplifier according to the background art which is based on EER technology.

With the power amplifier according to the first exemplary embodiment, furthermore, the drain of transistor 401 of RF amplifier 409 is supplied with amplitude component signal 414 through terminal 442 and output power supply circuit 440 to amplitude-modulate the signal amplified by transistor 401 with amplitude component signal 414, as with the power amplifier according to the background art shown in FIG. 1. As shown in FIG. 11, amplitude modulation causes RF amplifier 409 to output signal 425 that is generated by multiplying phase component signal 412 by rectangular-wave signal 422 and by multiplying the product by output signal (output power supply modulation signal) 414 from low-pass filter 406.

As shown in FIG. 12, signal 425 output from RF amplifier 409 has such frequency characteristics that amplified and reproduced baseband signal component 428 has central frequency fc with spurious components 429a, 429b caused by rectangular-wave signal 422 in the opposite side bands thereof.

As signal 425 output from RF amplifier 409 passes through bandpass filter 407 which has a frequency band wider than frequency band 428 of the baseband signal and which is capable of removing spurious components 429a, 429b caused by rectangular-wave signal 422, unwanted spurious components 429a, 429b added to signal 425 output from RF amplifier 409 are removed, thereby producing desired RF signal 415 which is representative of the linearly amplified input signal.

As described above, the power amplifier according to the first exemplary embodiment reduces the dynamic ranges of first control signal 418 and second control signal 419 so as to be smaller than the dynamic range of AM component a(t) of the original input signal. Therefore, the average output voltage of switching amplifier 405 and the output voltage of RF amplifier 409 are prevented from being lowered, thus preventing the power efficiency of RF amplifier 409 and switching amplifier 405 from being lowered.

Inasmuch as first control signal 418 is converted into the rectangular-wave signal having the constant amplitude and the rectangular-wave signal is input to RF amplifier 409, the information of first control signal 418 is not lost, but is properly reflected in the output signal of RF amplifier 409 even when RF amplifier 409 is saturated state in operation.

Figure 7:
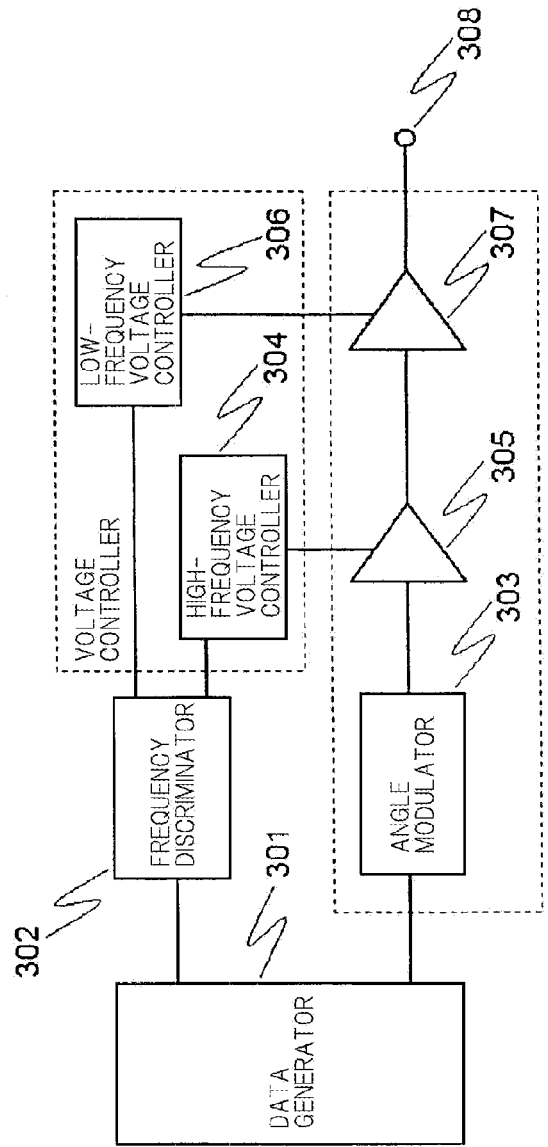
FIG. 7 is a block diagram showing another configurational example of the power amplifier according to the background art which is based on EER technology.
Figure 8:
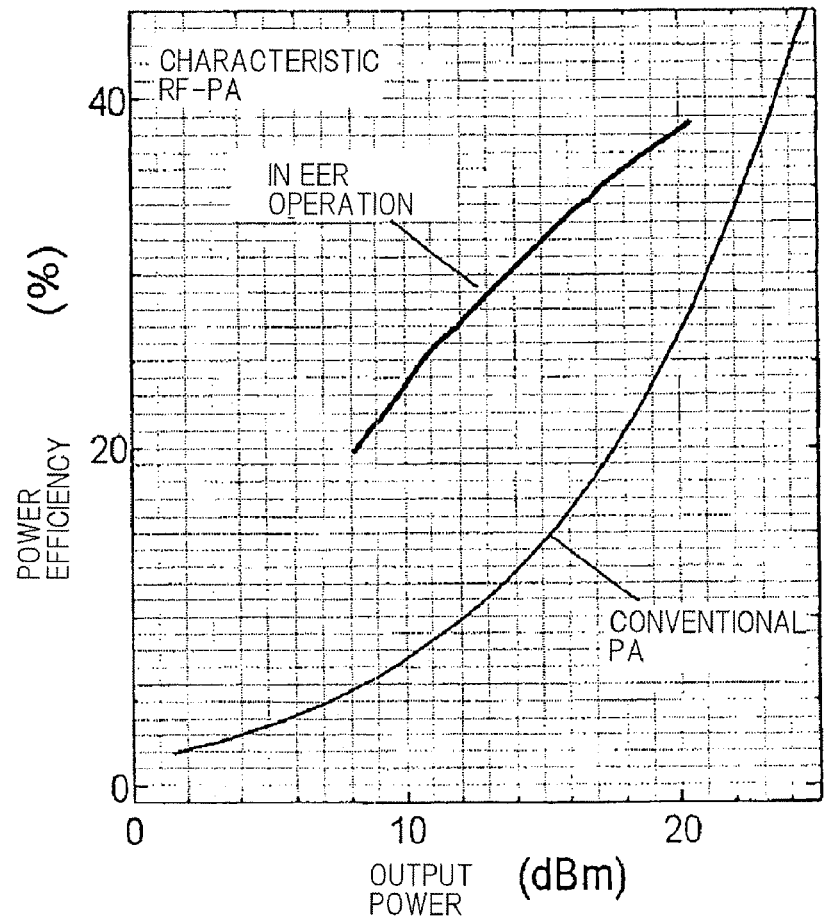
FIG. 8 is a graph showing power efficiency characteristics when an RF amplifier shown in FIG. 1 is supplied with a constant power supply voltage and also showing power efficiency characteristics when the RF amplifier shown in FIG. 1 is in EER operation.

The power amplifier according to the present exemplary embodiment thus produces, as the output signal, a signal representative of the waveform of the input signal that is restored more accurately than with the power amplifier according to the background art shown in FIG. 7 which does not reflect a portion of the amplitude component signal and which fails to reproduce the signal properly.

Figure 16:
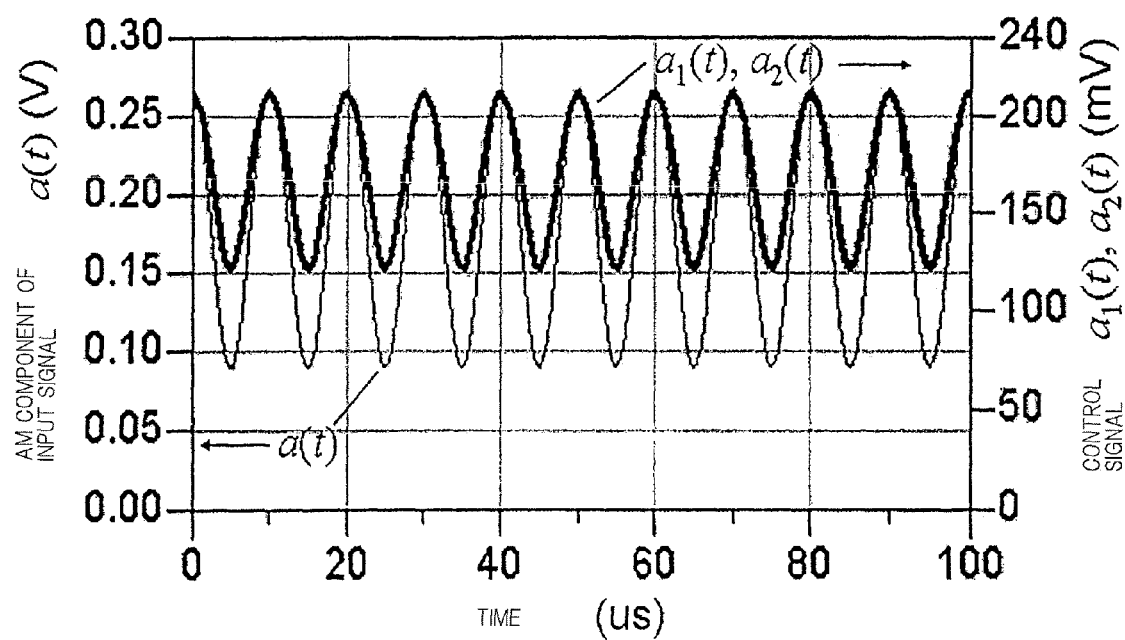
FIG. 16 is a waveform diagram showing the waveforms of the AM component of an input signal and a first control signal and a second control signal of the power amplifier shown in FIG. 10.
Figure 17:
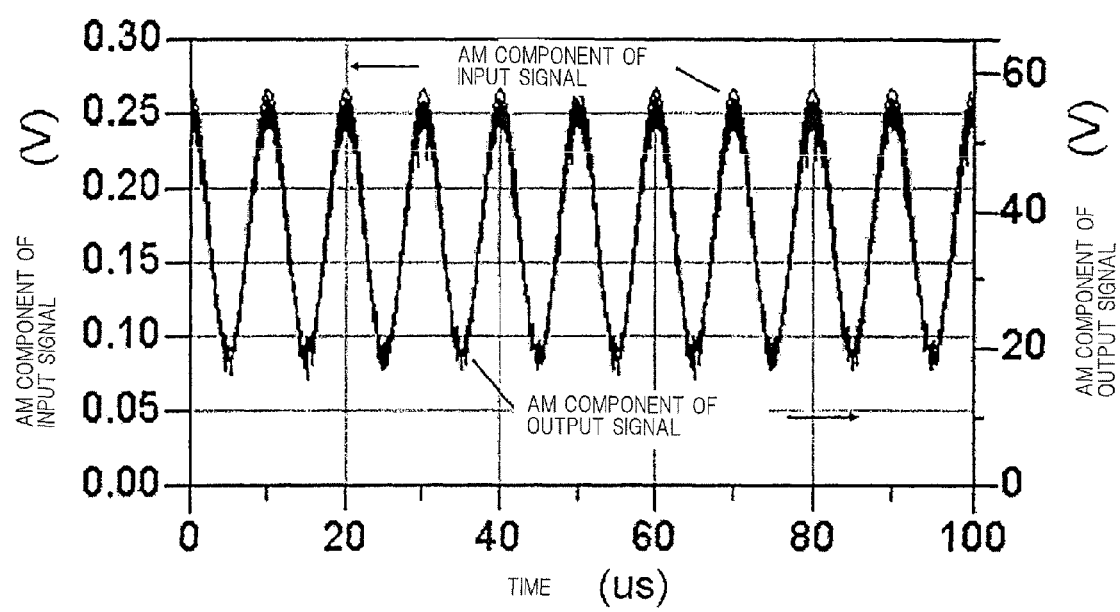
FIG. 17 is a waveform diagram showing the AM waveform of an input/output signal (RF) of the power amplifier shown in FIG. 10.

For example, FIGS. 16 and 17 show signal waveforms in principal portions of the power amplifier according to the present exemplary embodiment wherein an RF signal (central frequency of 1.95 GHz) that is amplitude-modulated with a sine wave having a frequency of 100 kHz is applied as the input signal, and first control signal ($a_1(t)$) 418 and second control signal ($a_2(t)$) 419 are related to each other by $a_1(t)=a_2(t)$ proportional to sqrt(a(t)) where sqrt(a(t)) represents a root (e.g., a square root) of a(t).

FIG. 16 is a waveform diagram showing the waveforms of AM component a(t) of the input signal and first control signal 418 and second control signal 419.

As shown in FIG. 16, with the power amplifier according to the present exemplary embodiment, first control signal ($a_1(t)$) 418 and second control signal ($a_2(t)$) 419 have a dynamic range smaller than AM component a(t) of the input signal. Specifically, whereas the amplitude component of the input signal has a maximum/minimum ratio of 3.0, first control signal ($a_1(t)$) 418 and second control signal ($a_2(t)$) 419 have a reduced maximum/minimum ratio of 1.7. Accordingly, the average output voltage of switching amplifier 405 and the output voltage of RF amplifier 409 are prevented from being lowered, thus preventing the power efficiency of RF amplifier 409 and switching amplifier 405 from being lowered.

When $a_1(t)=a_2(t)$ proportional to sqrt(a(t)) is satisfied, first control signal ($a_1(t)$) 418 and second control signal ($a_2(t)$) 419 satisfy the relationship: a(t) proportional to $a_1(t)a_2(t)$. Therefore, the power amplifier shown in FIG. 10 is capable of accurately restoring original AM component a(t)) from first control signal 418 and second control signal 419.

FIG. 17 is a waveform diagram showing the AM waveform of an input/output signal (RF) of the power amplifier shown in FIG. 10.

It can be seen from FIG. 17 that with the power amplifier according to the present exemplary embodiment, if the input signal is multiplied by a given constant to match the output signal in scale, then their waveforms are essentially in conformity with each other, indicating that the input signal is linearly amplified.

First control signal ($a_1(t)$) 418 and second control signal ($a_2(t)$) 419 are not limited to the relationship: $a_1(t)=a_2(t)$ proportional to sqrt(a(t)), but may be of the relationship: $a_1(t)$ proportional to $[a(t)]^{n1}$, $a_2(t)$ proportional to $[a(t)]^{n2}$ (n1+n2=1), for example. It is desirable that n1, n2<1 in order to satisfy the condition that amplitude components $a_1(t)$, $a_2(t)$ have a smaller dynamic range than AM component a(t).

Figure 18:
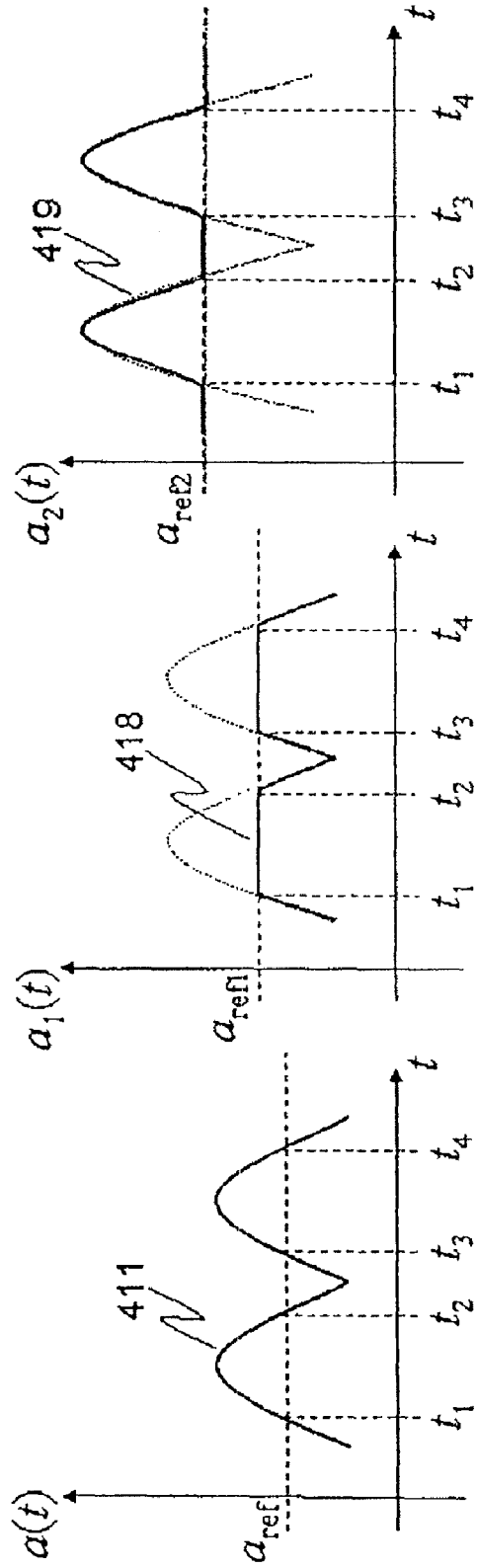
FIG. 18 is a graph showing an example of setting the first control signal and the second control signal of the power amplifier shown in FIG. 10.

Moreover, first control signal ($a_1(t)$) 418 and second control signal ($a_2(t)$) 419 may be set as shown in FIG. 18.

For example, predetermined threshold value $a_{ref}$ is set for AM component a(t). If a(t) is smaller than threshold value $a_{ref}$, then first control signal 418 may be set to a value proportional to a(t) and second control signal 419 may be set to constant value $a_{ref2}$. If a(t) is equal to or greater than threshold value $a_{ref}$, then first control signal 418 may be set to constant value $a_{ref1}$ and second control signal 419 may be set to a value proportional to a(t).

In other words, when a(t) is equal to or greater than threshold value $a_{ref}$, then first control signal 418 is set to a constant value, and when a(t) is smaller than threshold value $a_{ref}$, then first control signal 418 is set to a value proportional to a(t). When a(t) is equal to or greater than threshold value $a_{ref}$, then second control signal 419 is set to a value proportional to a(t), and when a(t) is smaller than threshold value $a_{ref}$, then second control signal 419 is set to a constant value.

Inasmuch as first control signal 418 and second control signal 419 thus set have a smaller dynamic range than original AM component a(t), the output voltage of switching amplifier 405 and the output voltage of RF amplifier 409 are prevented from being lowered, thus preventing the power efficiency of RF amplifier 409 and switching amplifier 405 from being lowered. As first control signal ($a_1(t)$) 418 and second control signal ($a_2(t)$) 419 satisfy the relationship: a(t) proportional to $a_1(t) a_2(t)$, the input signal is linearly amplified. The same operation is realized even if $a_1(t)$ and $a_2(t)$ are switched around.

First control signal 418 and second control signal 419 are not limited to the values set as described above, but may have any value insofar as first control signal 418 and/or second control signal 419 has a smaller dynamic range than original AM component a(t) (provided a(t) proportional to $a_1(t) a_2(t)$).

Figure 19:
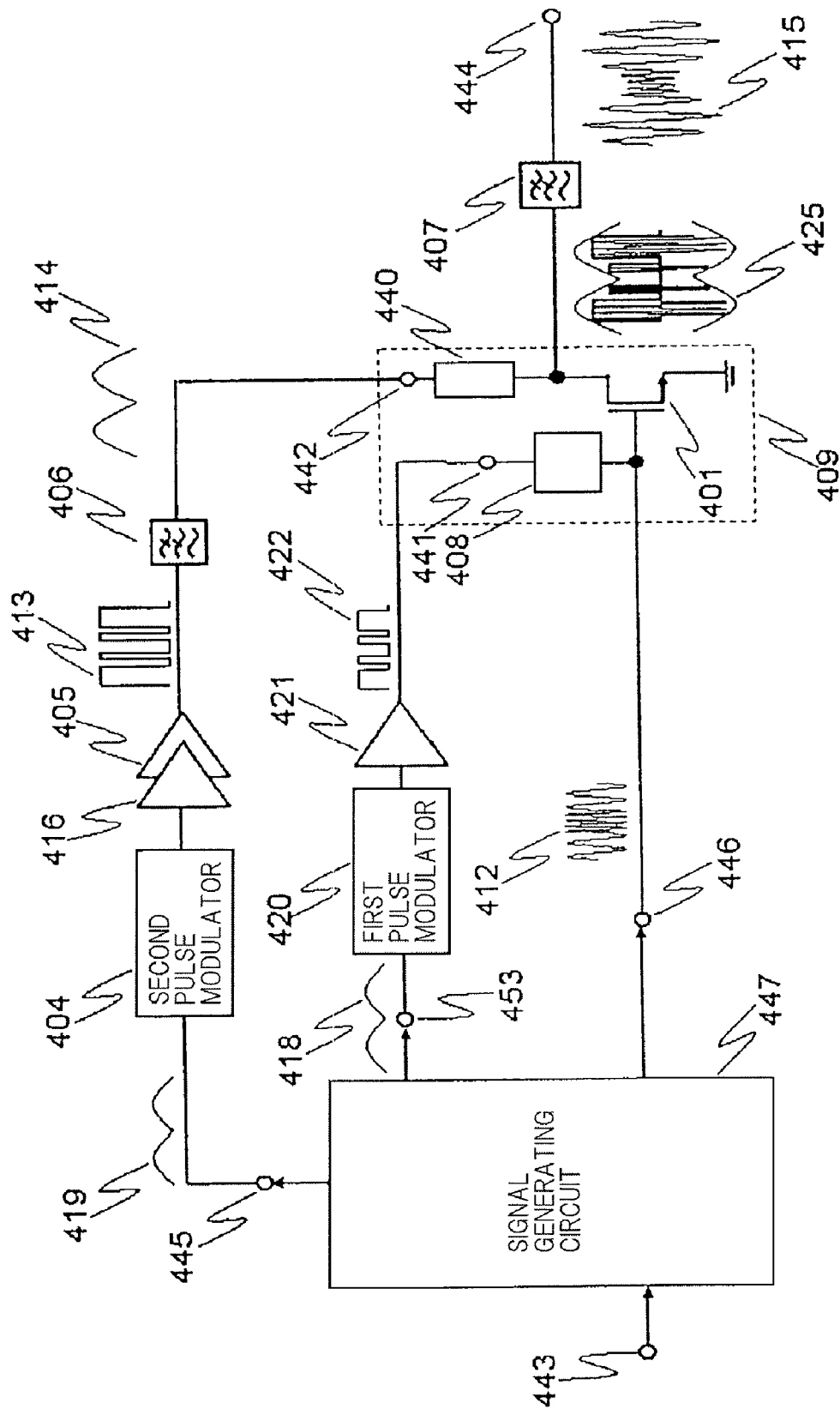
FIG. 19 is a block diagram showing a first modification of the power amplifier according to the first exemplary embodiment.
Figure 20:
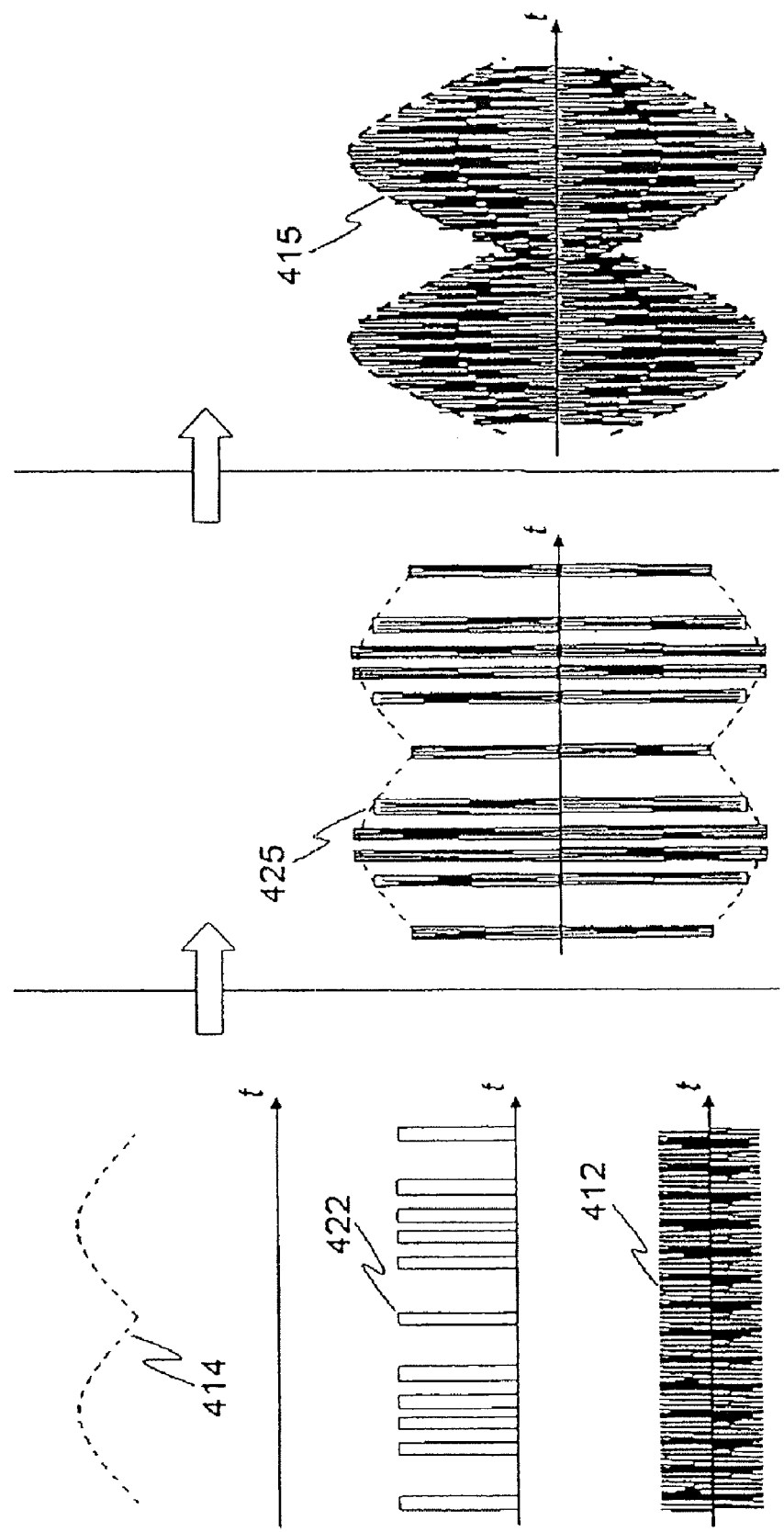
FIG. 20 is a waveform diagram showing signal waveforms in principal portions of the power amplifier shown in FIG. 19.
Figure 21:
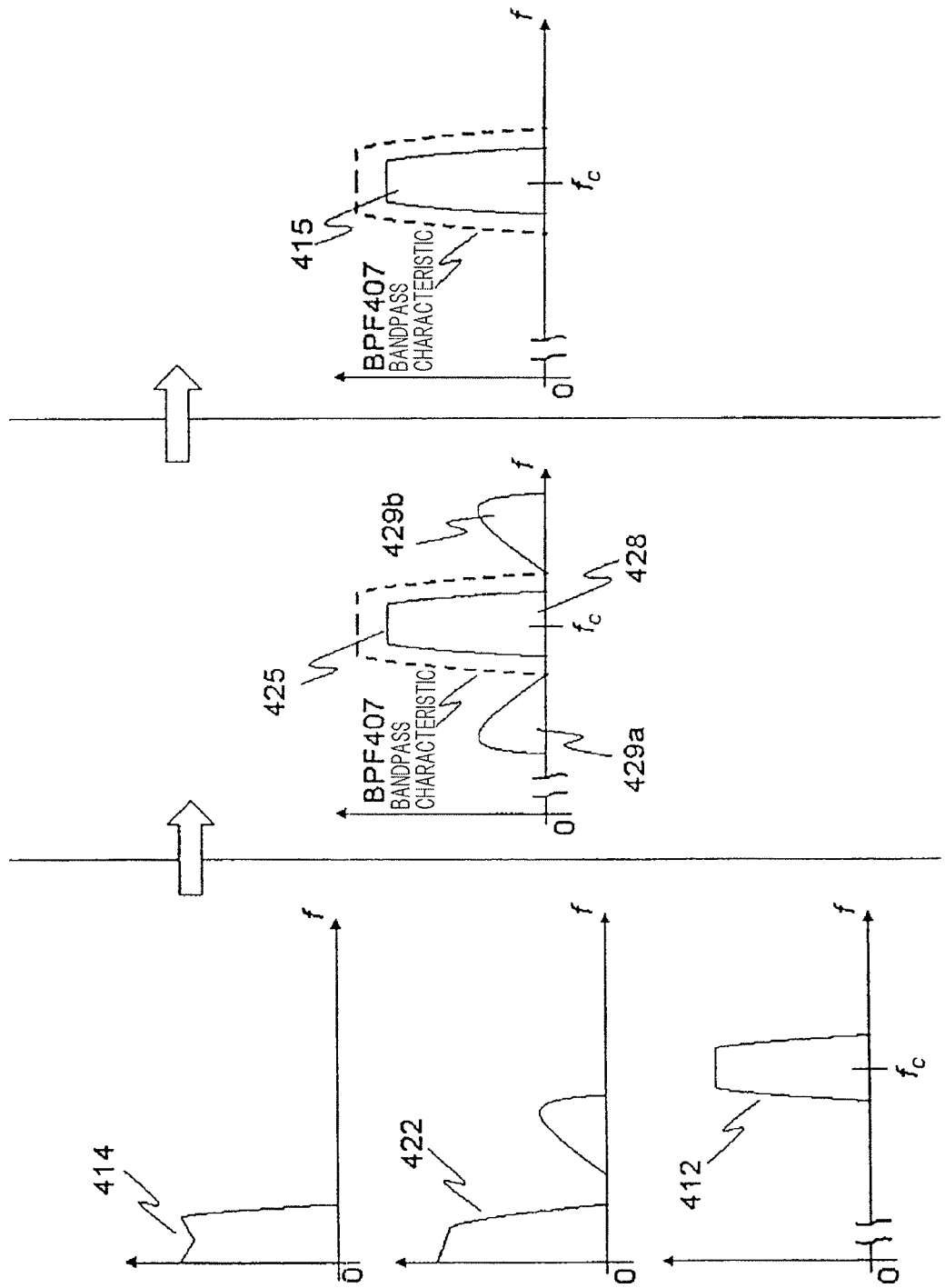
FIG. 21 is a graph showing the frequency characteristics of the signals shown in FIG. 19.

FIG. 19 is a block diagram showing a first modification of the power amplifier according to the first exemplary embodiment. FIG. 20 is a waveform diagram showing signal waveforms in principal portions of the power amplifier shown in FIG. 19. FIG. 21 is a graph showing the frequency characteristics of the signals shown in FIG. 19. FIG. 19 shows a configurational example of the power amplifier based on the EER technology.

The power amplifier shown in FIG. 19 is different from the configuration shown in FIG. 10 in that mixer 423 is omitted from the configuration shown in FIG. 10, phase component signal 412 output from signal generating circuit 447 is input to RF amplifier 409, and rectangular-wave signal 422 that is output from first driver amplifier 421 is input to RF amplifier 409. Rectangular-wave signal 422 is applied to the gate of transistor 401 through terminal 441 and input power supply circuit 408.

When transistor 401 is turned on and off by rectangular-wave signal 422, the power amplifier shown in FIG. 19 adds rectangular-wave signal 422 to phase component signal 412 as with the power amplifier shown in FIG. 10.

According to this arrangement, as shown in FIG. 20, RF amplifier 409 also outputs signal 425 that is generated by multiplying phase component signal 412 by rectangular-wave signal 422 and by multiplying the product by output signal (output power supply modulation signal) 414 from low-pass filter 406.

As shown in FIG. 21, signal 425 output from RF amplifier 409 has frequency characteristics such that amplified and reproduced baseband signal component 428 has central frequency fc with spurious components 429a, 429b caused by rectangular-wave signal 422 in the opposite side bands thereof.

With the power amplifier shown in FIG. 19, as with the power amplifier shown in FIG. 10, signal generating circuit 447 outputs first control signal 418 ($a_1(t)$) and second control signal 419 ($a_2(t)$) which have a smaller dynamic range than AM component a(t) and satisfy the relationship: a(t) proportional to $a_1(t) a_2(t)$, so that the output voltage of switching amplifier 405 and the output voltage of RF amplifier 409 are prevented from being lowered, thus preventing the power efficiency of RF amplifier 409 and switching amplifier 405 from being lowered. The power amplifier shown in FIG. 19 allows the waveform of the input signal to be restored in the output signal with higher accuracy than with the power amplifier according to the background art shown in FIG. 7. Furthermore, since the power amplifier shown in FIG. 19 requires no mixer 423, it is made up of a smaller number of parts, and hence consumes a lower amount of electric power and is manufactured at a lower cost than the power amplifier shown in FIG. 10.

Figure 22:
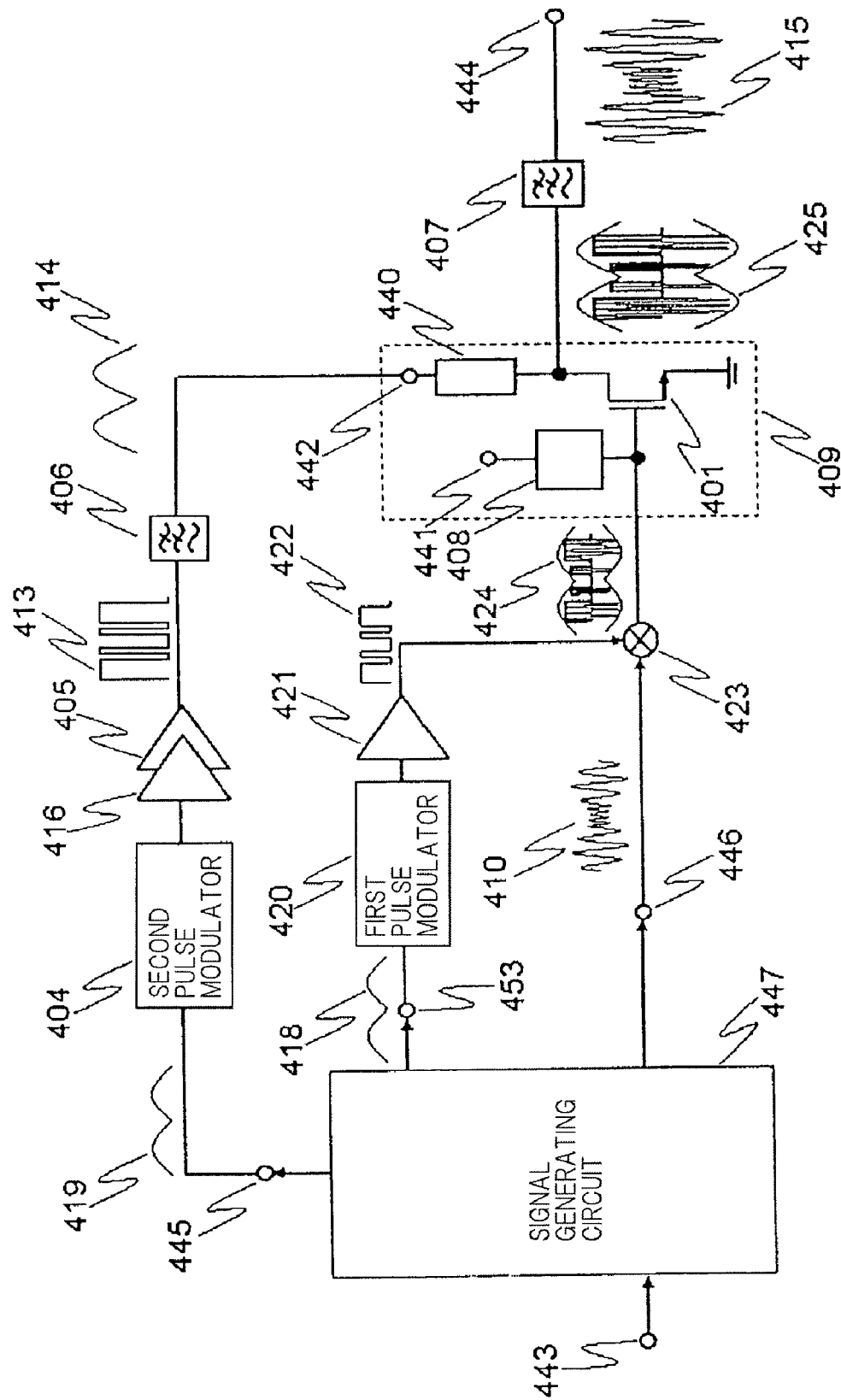
FIG. 22 is a block diagram showing a second modification of the power amplifier according to the first exemplary embodiment.

FIG. 22 is a block diagram showing a second modification of the power amplifier according to the first exemplary embodiment. FIG. 22 shows a configurational example of the power amplifier based on the ET technology.

The power amplifier based on the ET technology is different from power amplifier based on the EER technology shown in FIG. 10 as to configurational and operational details of signal generating circuit 447. The configurational and operational details of the other components are the same as those of the power amplifier based on the EER technology shown in FIG. 10 and will not be described below. In FIG. 22, the components that make up the power amplifier are denoted by the same reference characters as those of the power amplifier shown in FIG. 10.

As with the power amplifier shown in FIG. 10, signal generating circuit 447 shown in FIG. 22 extracts an AM component included in an input signal, outputs first control signal 418 generated from the AM component through terminal 453 to first pulse modulator 420, and outputs second control signal 419 generated from the AM component through terminal 445 to second pulse modulator 404. If it is assumed that the AM component of the input signal is denoted by a(t), then signal generating circuit 447 outputs amplitude component $a_2(t)$, which has a smaller dynamic range than AM component a(t) and satisfies the relationship: a(t) proportional to $a_1(t) a_2(t)$, as first control signal 418 to first pulse modulator 420, and also outputs amplitude component $a_2(t)$ as second control signal 419 to second pulse modulator 404. Signal generating circuit 447 shown in FIG. 22 also outputs modulated signal 410 that is proportional to the amplitude of the input signal which includes the AM component and a PM component, through terminal 446 to mixer 423. Signal generating circuit 447 should preferably have a function to adjust the delay time difference between first control signal 418 and phase component signal 412 and the delay time difference between second control signal 419 and phase component signal 412.

Figure 23:
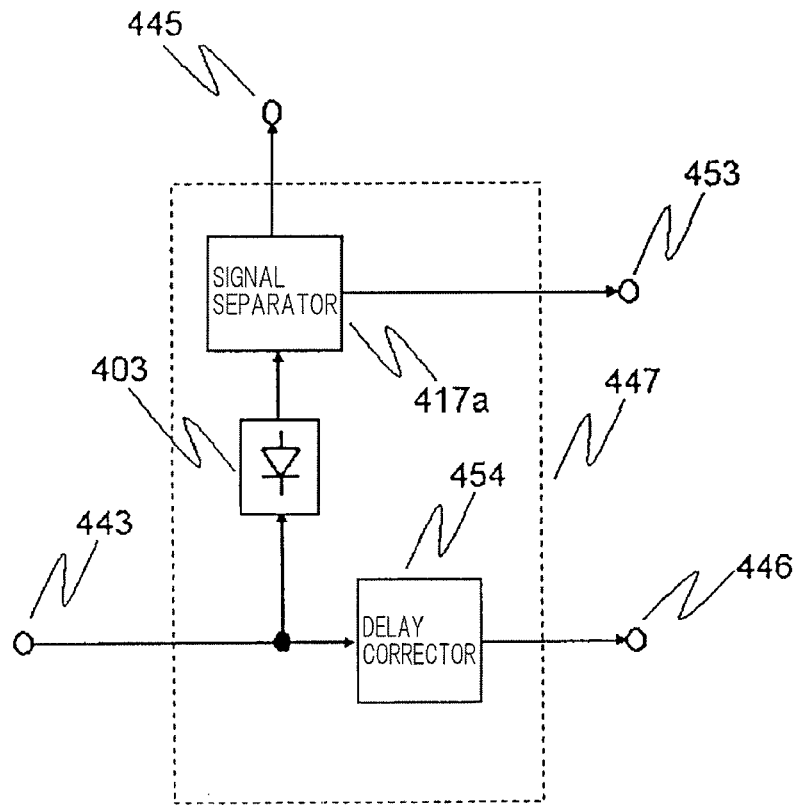
FIG. 23 is a block diagram showing a configurational example of a signal generating circuit shown in FIG. 22.
Figure 24:
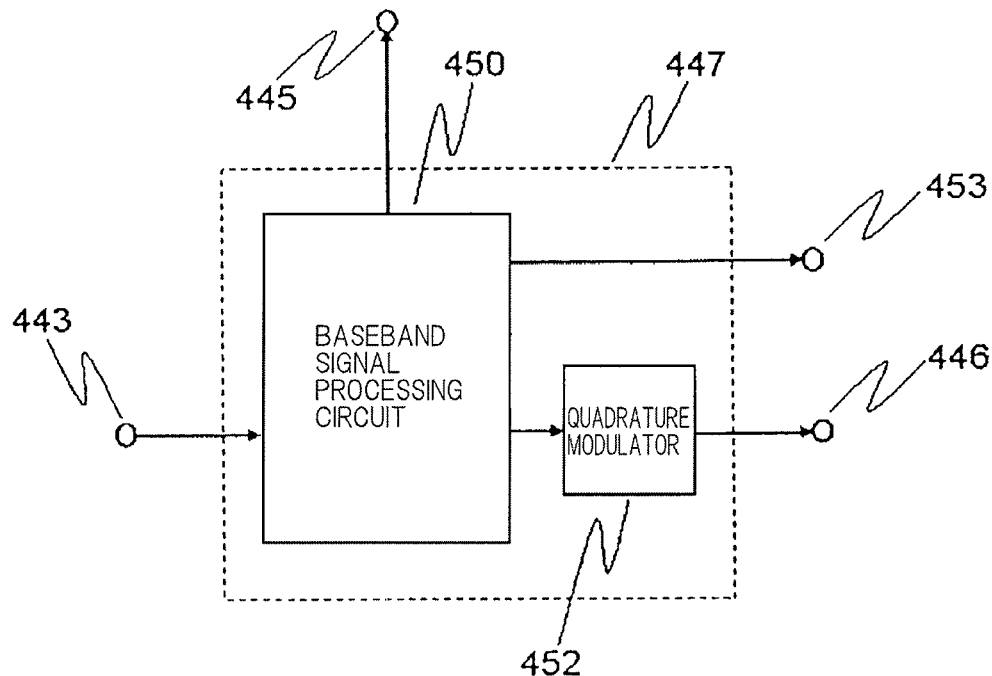
FIG. 24 is a block diagram showing another configurational example of the signal generating circuit shown in FIG. 22.

FIG. 23 is a block diagram showing a configurational example of the signal generating circuit shown in FIG. 22, and FIG. 24 is a block diagram showing another configurational example of the signal generating circuit shown in FIG. 22. Signal generating circuit 447 shown in FIG. 23 is of a configuration that is optimum for an application wherein an RF signal is input to input terminal 443 of the power amplifier, and signal generating circuit 447 shown in FIG. 24 is of a configuration that is optimum for an application wherein a baseband signal is input to input terminal 143 of the power amplifier.

Signal generating circuit 447 shown in FIG. 23 comprises amplitude detector 403 for extracting an AM component from an RF signal as an input signal, and signal separator 417a for decomposing the AM component extracted from the input signal by amplitude detector 403. The input signal input from terminal 443 is supplied to amplitude detector 403 and is also output as modulated signal 410 from terminal 446.

Amplitude detector 403 extracts the AM component of the input signal (RF signal) input from terminal 443, and outputs the extracted AM component to signal separator 417a. Signal separator 417a decomposes AM component a(t) of the input signal into amplitude components $a_1(t)$, $a_2(t)$ which satisfy the relationship: a(t) proportional to $a_1(t)\, a_2(t)$, outputs first control signal 418 having amplitude component $a_1(t)$ to terminal 453, and outputs second control signal 419 having amplitude component $a_2(t)$ to terminal 445.

Signal separator 417a may be implemented by a digital signal processor (DSP) including logic circuits, an A/D (analog-to-digital) converter, and a D/A converter, an arithmetic circuit comprising an analog circuit, or the like.

Signal generating circuit 447 shown in FIG. 23 also includes delay corrector 454 which is capable of adjusting the delay time difference between the AM component extracted from the input signal by amplitude detector 403 and modulated signal 410 that is output to terminal 446.

Signal generating circuit 447 shown in FIG. 24 comprises baseband signal processing circuit 450 and quadrature modulator 452. In baseband signal processing circuit 450, the DSP calculates and extracts amplitude components $a_1(t)$, $a_2(t)$ which satisfy the relationship: a(t) proportional to $a_1(t)\, a_2(t)$ from AM component a(t) of the baseband signal that is input from terminal 443 according to a digital processing process, and the D/A converter converts amplitude components $a_1(t)$, $a_2(t)$ into analog signals, and thereafter outputs amplitude component $a_1(t)$ as first control signal 418 to terminal 453 and outputs amplitude component $a_2(t)$ as second control signal 419 to terminal 445. Furthermore, the D/A converter converts the baseband signal input from terminal 443 into an analog signal and thereafter outputs the analog signal to quadrature modulator 452. Baseband signal processing circuit 450 should preferably have a function, implemented by the DSP, to calculate and correct the delay time difference between control signals 418, 419 and the baseband signal output to quadrature modulator 452.

Quadrature modulator 452 up-converts the baseband signal output from baseband signal processing circuit 450 into an RF frequency signal, and outputs the RF frequency signal as modulated signal 410 from terminal 445.

In FIG. 22, signal generating circuit 447 has a D/A converter for outputting first control signal 418 and second control signal 419 as analog signals. However, if signal generating circuit 447 includes signal separator 417a comprising a DSP shown in FIG. 23 or baseband signal processing circuit 450 shown in FIG. 24, then signal generating circuit 447 may output first control signal 418 and second control signal 419 as digital signals. In this case, first pulse modulator 420 and second pulse modulator 404 may include respective D/A converters. Baseband signal processing circuit 450 and signal separator 417a of signal generating circuit 447 may include the functions of first pulse modulator 420 and second pulse modulator 404. In this case, first pulse modulator 420 and second pulse modulator 404 may be dispensed with.

As with the power amplifier shown in FIG. 10, the arrangement shown in FIG. 22 outputs first control signal 418 ($a_1(t)$) and second control signal 419 ($a_2(t)$) which have a smaller dynamic range than AM component a(t) of the input signal (provided that the relationship: a(t) proportional to $a_1(t)\, a_2(t)$ is satisfied) to first pulse modulator 420 and second pulse modulator 404. Therefore, the average output voltage of switching amplifier 405 and the output voltage of RF amplifier 409 are prevented from being lowered, thus preventing the power efficiency of RF amplifier 409 and switching amplifier 405 from being lowered.

Inasmuch as first control signal 418 is converted into the rectangular-wave signal with the constant amplitude and the rectangular-wave signal is input to RF amplifier 409, the information of first control signal 418 is not lost, but is properly reflected in the output signal of RF amplifier 409 even when RF amplifier 409 is saturated state in operation.

The power amplifier according to the present exemplary embodiment thus restores the waveform of the input signal in the output signal more accurately than with the power amplifier according to the background art shown in FIG. 7 which does not reflect a portion of the amplitude component signal and fails to reproduce the signal properly.

Figure 25:
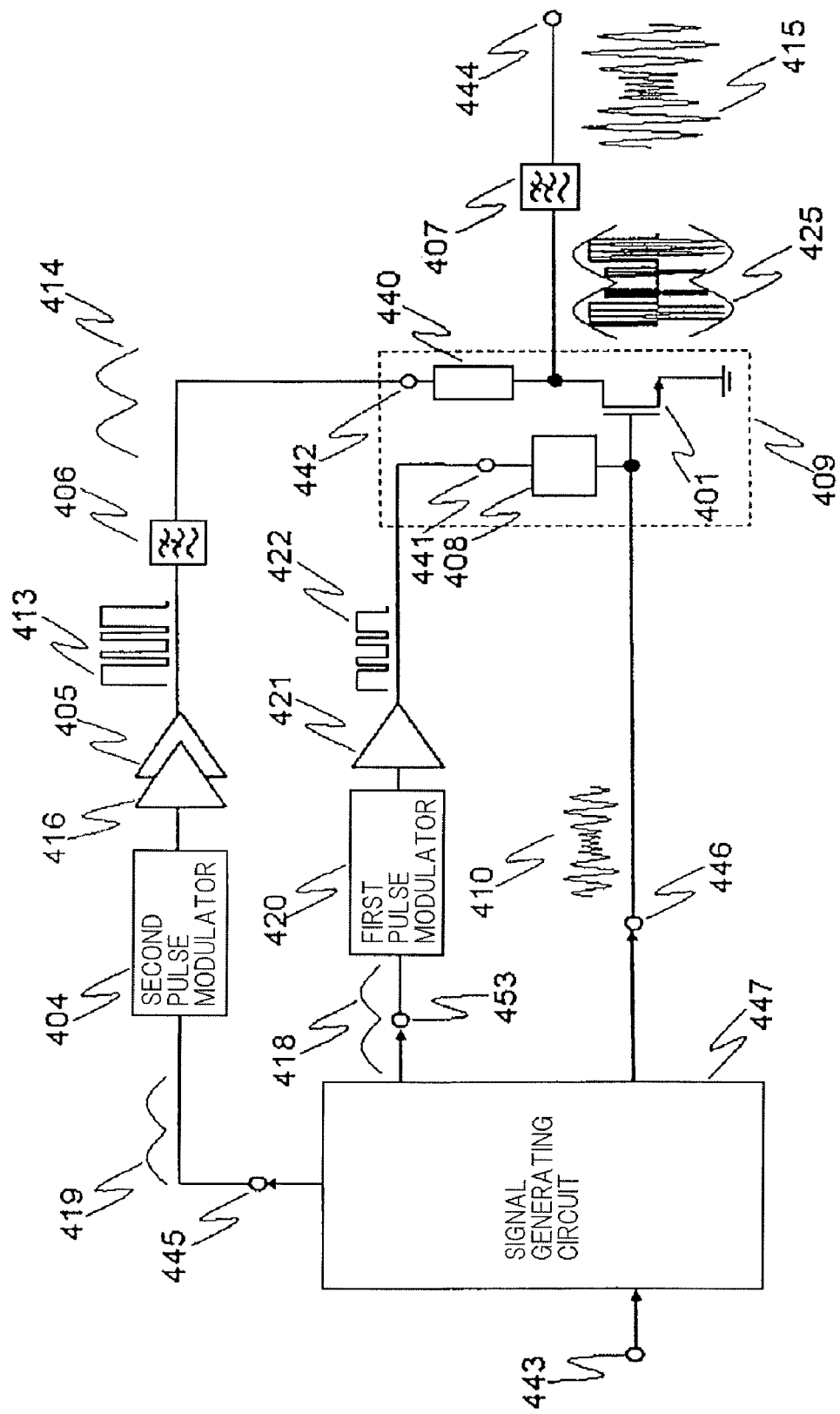
FIG. 25 is a block diagram showing a third modification of the power amplifier according to the first exemplary embodiment.

FIG. 25 is a block diagram showing a third modification of the power amplifier according to the first exemplary embodiment. FIG. 25 shows a configurational example of the power amplifier based on the ET technology.

The power amplifier shown in FIG. 25 is different from the configuration shown in FIG. 22 in that mixer 423 is omitted from the configuration shown in FIG. 22, modulated signal 410 that is output from signal generating circuit 447 is input to RF amplifier 409, and rectangular-wave signal 422 output from first driver amplifier 421 is input to RF amplifier 409. Rectangular-wave signal 422 is applied to the gate of transistor 401 through terminal 441 and to input power supply circuit 408.

When transistor 401 is turned on and off by rectangular-wave signal 422, the power amplifier shown in FIG. 25 adds rectangular-wave signal 422 to modulated signal 410 as with the power amplifier shown in FIG. 22.

As with the power amplifier shown in FIG. 22, signal generating circuit 447 outputs first control signal 418 ($a_1(t)$) and second control signal 419 ($a_2(t)$) which have a smaller dynamic range than AM component a(t) and satisfy the relationship: a(t) proportional to $a_1(t)\, a_2(t)$, so that the output voltage of switching amplifier 405 and the output voltage of RF amplifier 409 are prevented from being lowered, thus preventing the power efficiency of RF amplifier 409 and switching amplifier 405 from being lowered. The power amplifier shown in FIG. 25 allows the waveform of the input signal to be restored in the output signal with higher accuracy than with the power amplifier according to the background art shown in FIG. 7. Furthermore, since the power amplifier shown in FIG. 25 requires no mixer 423, it is made up of a smaller number of parts, and hence consumes a lower amount of electric power and is manufactured at a lower cost than the power amplifier shown in FIG. 22.

The power amplifier according to the present exemplary embodiment extracts an amplitude-modulated component from an input signal (modulated signal) which include amplitude-modulated and phase-modulated components, decomposes the amplitude-modulated component into two control signals whose product is proportional to the amplitude-modulated component, modulates the output power supply of the RF amplifier with one of the control signals (second control signal), converts the other control signal (first control signal) into a rectangular-wave signal having a constant amplitude, and modulates the input signal of the RF amplifier with the rectangular-wave signal. Therefore, the information of the first control signal is not lost, but is properly reflected in the output signal of the RF amplifier even when the RF amplifier is saturated state in operation.

The power amplifier according to the present exemplary embodiment thus produces, as the output signal, a signal representative of the waveform of the input signal that is restored more accurately than with the power amplifier according to the background art shown in FIG. 7 which does not reflect a portion of the amplitude component signal and fails to reproduce the signal properly.

Consequently, there are provided power amplifiers based on EER technology and ET technology which are capable of amplifying a signal with good power efficiency and restoring the signal accurately.

With the power amplifier according to the present exemplary embodiment, since first control signal 418 and second control signal 419 (or either one of them) have a smaller dynamic range than original AM component a(t), the average output voltage of switching amplifier 405 and the output voltage of RF amplifier 409 are prevented from being lowered, thus preventing the power efficiency of RF amplifier 409 and switching amplifier 405 from being lowered.

Second Exemplary Embodiment

A power amplifier according to a second exemplary embodiment will be described below with reference to the drawings.

The power amplifier according to the second exemplary embodiment is different from the power amplifier according to the first exemplary embodiment shown in FIG. 10 as to configurational and operational details of signal generating circuit 447. The configurational and operational details of the other components are the same as those of the power amplifier according to the first exemplary embodiment shown in FIG. 10 and will not be described below.

As with the power amplifier shown in FIG. 10, signal generating circuit 447 according to the present exemplary embodiment extracts an AM component included in an input signal, outputs first control signal 418 generated from the AM component through terminal 453 to first pulse modulator 420, and outputs second control signal 419 generated from the AM component through terminal 445 to second pulse modulator 404. According to the present exemplary embodiment, if it is assumed that the AM component of the input signal is denoted by a(t), then signal generating circuit 447 outputs amplitude component $a_s(t)$, which has a smaller dynamic range than AM component a(t) and satisfies the relationship: a(t) proportional to $a_s(t)a_f(t)$, as first control signal 418 to first pulse modulator 420, and also outputs amplitude component $a_f(t)$ as second control signal 419 to second pulse modulator 404.

$a_s(t)$ represents a low-frequency component of AM component a(t), and $a_f(t)$ represents the remaining frequency component produced by removing $a_s(t)$ from a(t) ($a_f(t)$ proportional to a(t)/$a_s(t)$). Signal generating circuit 447 according to the present exemplary embodiment also extracts a PM component included in the input signal and outputs the extracted PM component as phase component signal 412 through terminal 446 to RF amplifier 409. Signal generating circuit 447 according to the present exemplary embodiment should preferably have a function to adjust the delay time difference between first control signal 418 and phase component signal 412 and the delay time difference between second control signal 419 and phase component signal 412.

Figure 26:
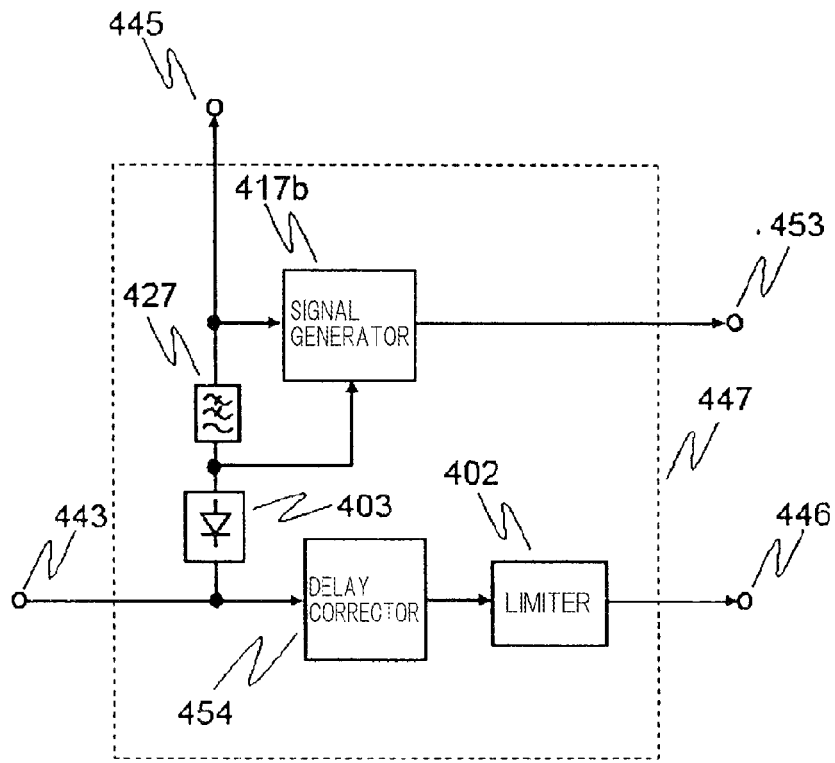
FIG. 26 is a block diagram showing a configurational example of a signal generating circuit for use in a power amplifier according to a second exemplary embodiment.

FIG. 26 is a block diagram showing a configurational example of a signal generating circuit for use in the power amplifier according to the second exemplary embodiment. Signal generating circuit 447 shown in FIG. 26 is of a configuration that is optimum for an application wherein an RF signal is input to input terminal 443 of the power amplifier. The configuration shown in FIG. 26 is optimum for use in the power amplifier according to the present exemplary embodiment which is based on the EER technology.

Signal generating circuit 447 shown in FIG. 26 comprises amplitude detector 403 for extracting an AM component from an RF signal as an input signal, limiter 402 for removing the AM component of the input signal, low-pass filter 427 for allowing low-frequency component $a_s(t)$ of AM component a(t) extracted from the input signal by amplitude detector 403 to pass trough, and signal generator 417b for generating remaining frequency component $a_f(t)$ produced by removing $a_s(t)$ from a(t).

Amplitude detector 403 extracts AM component a(t) of the input signal (RF signal) input from terminal 443, and outputs the extracted AM component to low-pass filter 427. Low-pass filter 427 allows a low-frequency component of AM component a(t) extracted by amplitude detector 403 to pass through, and outputs second control signal 419 having amplitude component $a_s(t)$ to terminal 445.

Signal separator 417b generates $a_f(t)$ which satisfies a(t) proportional to $a_s(t)a_f(t)$, i.e., $a_f(t)$ proportional to a(t)/$a_s(t)$, from AM component a(t) of the input signal and low-frequency component $a_s(t)$ output from low-pass filter 427, and outputs first control signal 418 having amplitude component $a_f(t)$ to terminal 453. Limiter 402 removes the AM component of the input signal (RF signal) that is input from terminal 443, and outputs phase component signal 412, which represents a remaining PM component, from terminal 446.

Signal separator 417b may be implemented by a digital signal processor (DSP) including logic circuits, an A/D (analog-to-digital) converter, and a D/A (digital-to-analog) converter, an arithmetic circuit comprising an analog circuit, or the like.

If a baseband signal is input to input terminal 443 of the power amplifier according to the present exemplary embodiment, then signal generating circuit 447 may comprise baseband signal processing circuit 450 and VCO 451 shown in FIG. 14. Baseband signal processing circuit 450 converts the input signal (baseband signal) input from terminal 443 into an analog signal, and up-converts the analog signal into an RF signal. Baseband signal processing circuit 450 then extracts an AM component of the RF signal, decomposes AM component a(t) into amplitude components $a_s(t)$, $a_f(t)$ which satisfy the relationship: a(t) proportional to $a_s(t)a_f(t)$, outputs first control signal 418 having amplitude component $a_f(t)$ to terminal 453, and outputs second control signal 419 having amplitude component $a_s(t)$ to terminal 445. VCO 451 is controlled by a control voltage output from baseband signal processing circuit 450 to output phase component signal 412 that is equal to a PM component of the up-converted RF signal.

If signal generating circuit 447 of the power amplifier according to the present exemplary embodiment has signal generator 417b which comprises a DSP shown in FIG. 26 or baseband signal processing circuit 450 shown in FIG. 14, then signal generating circuit 447 may output first control signal 418 and second control signal 419 as digital signals. In this case, first pulse modulator 420 and second pulse modulator 404 may include respective D/A converters. Baseband signal processing circuit 450 and signal separator 417a of signal generating circuit 447 may include the functions of first pulse modulator 420 and second pulse modulator 404. In this case, first pulse modulator 420 and second pulse modulator 404 may be dispensed with.

With the power amplifier according to the second exemplary embodiment, as with the first exemplary embodiment, phase component signal 412 output from signal generating circuit 447 and the rectangular-wave signal output from first driver amplifier 421 are mixed with each other, and the output signal is input to RF amplifier 409. The output signal of RF amplifier 409 is amplitude-modulated with output power supply modulation signal 414 which represents the amplified first control signal 419. RF amplifier 409 thus outputs signal 425 that is generated by multiplying phase component signal 412 by rectangular-wave signal 422 and by multiplying the product by output signal (output power supply modulation signal) 414 from low-pass filter 406.

As signal 425 that is output from RF amplifier 409 passes through bandpass filter 407 which has a frequency band that is wider than frequency band 428 of the baseband signal and that is capable of removing spurious components caused by rectangular-wave signal 422, unwanted spurious components added to signal 425 output from RF amplifier 409 are removed, thereby producing desired RF signal 415 which is representative of the linearly amplified input signal.

With the power amplifier according to the second exemplary embodiment, since second control voltage 419 has a low frequency, second driver amplifier 416 and switching amplifier 405 can be operated at a high voltage of several tens of volts.

While first control signal 418 has as high a frequency as the AM component of the input signal, the input voltage of RF amplifier 409 may usually be of a relatively low voltage of several volts even when the output electric power is large as in the case where the power amplifier is used in wireless base stations. Consequently, it is possible to operate first driver amplifier 418 at a relatively low voltage and at a desired high frequency.

The power amplifier according to the second exemplary embodiment offers the same advantages as those of the first exemplary embodiment, and is additionally applicable to apparatus which require a wide band and high output electric power because switching amplifier 405, first driver amplifier 416, and second driver amplifier 421 do not need to perform both high-voltage operation and fast operation.

Each of the first through third modifications of the first exemplary embodiment can also be applied to the power amplifier according to the second exemplary embodiment, and, when applied, provides not only the advantages described with respect to the first exemplary embodiment, but also the advantages described above.

Figure 27:
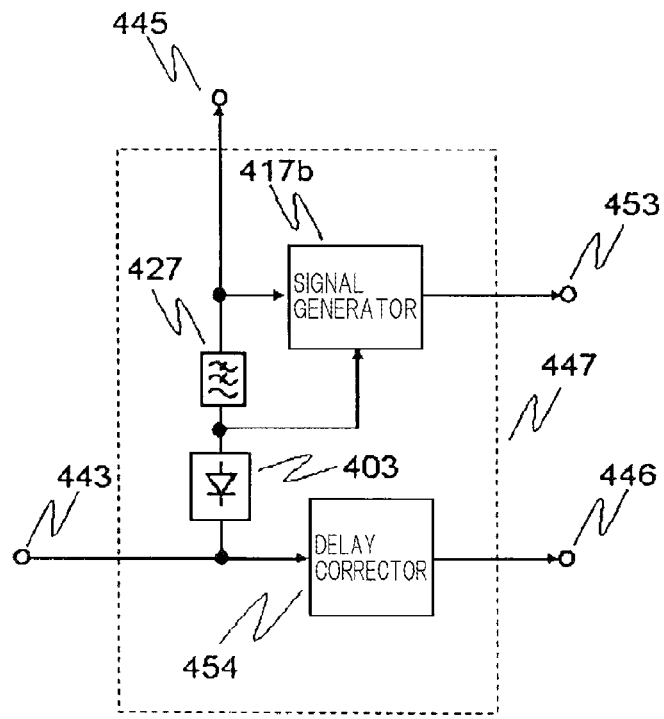
FIG. 27 is a block diagram showing another configurational example of the signal generating circuit for use in the power amplifier according to the second exemplary embodiment.

If the second modification and the third modification (ET technology) of the first exemplary embodiment are applied to the power amplifier according to the second exemplary embodiment, then signal generating circuit 447 may be of the configuration shown in FIG. 27 or the configuration shown in FIG. 24. Signal generating circuit 447 shown in FIG. 27 is of a configuration that is optimum for an application wherein an RF signal is input to the power amplifier according to the present exemplary embodiment.

Signal generating circuit 447 shown in FIG. 27 comprises amplitude detector 403 for extracting an AM component from an RF signal as an input signal, low-pass filter 427 for allowing a low-frequency component $a_s(t)$ of AM component a(t) extracted from the input signal by amplitude detector 403 to pass through, and signal generator 417b for generating remaining frequency component $a_f(t)$ produced by removing $a_s(t)$ from a(t).

The input signal input from terminal 443 is supplied to amplitude detector 403 and is also output as modulated signal 410 from terminal 446.

Amplitude detector 403 extracts AM component a(t) of the input signal (RF signal) input from terminal 443, and outputs the extracted AM component to low-pass filter 427. Low-pass filter 427 allows a low-frequency component of AM component a(t) extracted by amplitude detector 403 to pass through, and outputs second control signal 419 having amplitude component $a_s(t)$ to terminal 445.

Signal separator 417b generates $a_f(t)$ which satisfies a(t) proportional to $a_s(t)a_f(t)$, i.e., $a_f(t)$ proportional to $a(t)/a_s(t)$, from AM component a(t) of the input signal and low-frequency component $a_s(t)$ output from low-pass filter 427, and outputs first control signal 418 having amplitude component $a_f(t)$ to terminal 453.

Signal separator 417b may be implemented by a digital signal processor (DSP) including logic circuits, an A/D (analog-to-digital) converter, and a D/A (digital-to-analog) converter, an arithmetic circuit comprising an analog circuit, or the like.

If a baseband signal is input to input terminal 443 of the power amplifier according to the second modification and the third modification of the present exemplary embodiment, then signal generating circuit 447 may comprise baseband signal processing circuit 450 and quadrature modulator 452 shown in FIG. 24. Baseband signal processing circuit 450 converts the input signal (baseband signal) that is input from terminal 443 into an analog signal, and up-converts the analog signal into an RF signal. Baseband signal processing circuit 450 then extracts an AM component of the RF signal, decomposes AM component a(t) into amplitude components $a_s(t)$, $a_f(t)$ which satisfy the relationship: a(t) proportional to $a_s(t)$ $a_f(t)$, outputs first control signal 418 having amplitude component $a_f(t)$ to terminal 453, and outputs second control signal 419 having amplitude component $a_s(t)$ to terminal 445. Baseband signal processing circuit 450 also outputs a control signal for controlling the output signal of quadrature modulator 452.

Quadrature modulator 452 outputs modulated signal 410 which is proportional to the amplitude of the up-converted RF signal from terminal 446 according to the control signal output from baseband signal processing circuit 450.

Third Exemplary Embodiment

A power amplifier according to a third exemplary embodiment will be described below with reference to the drawings.

Figure 28:
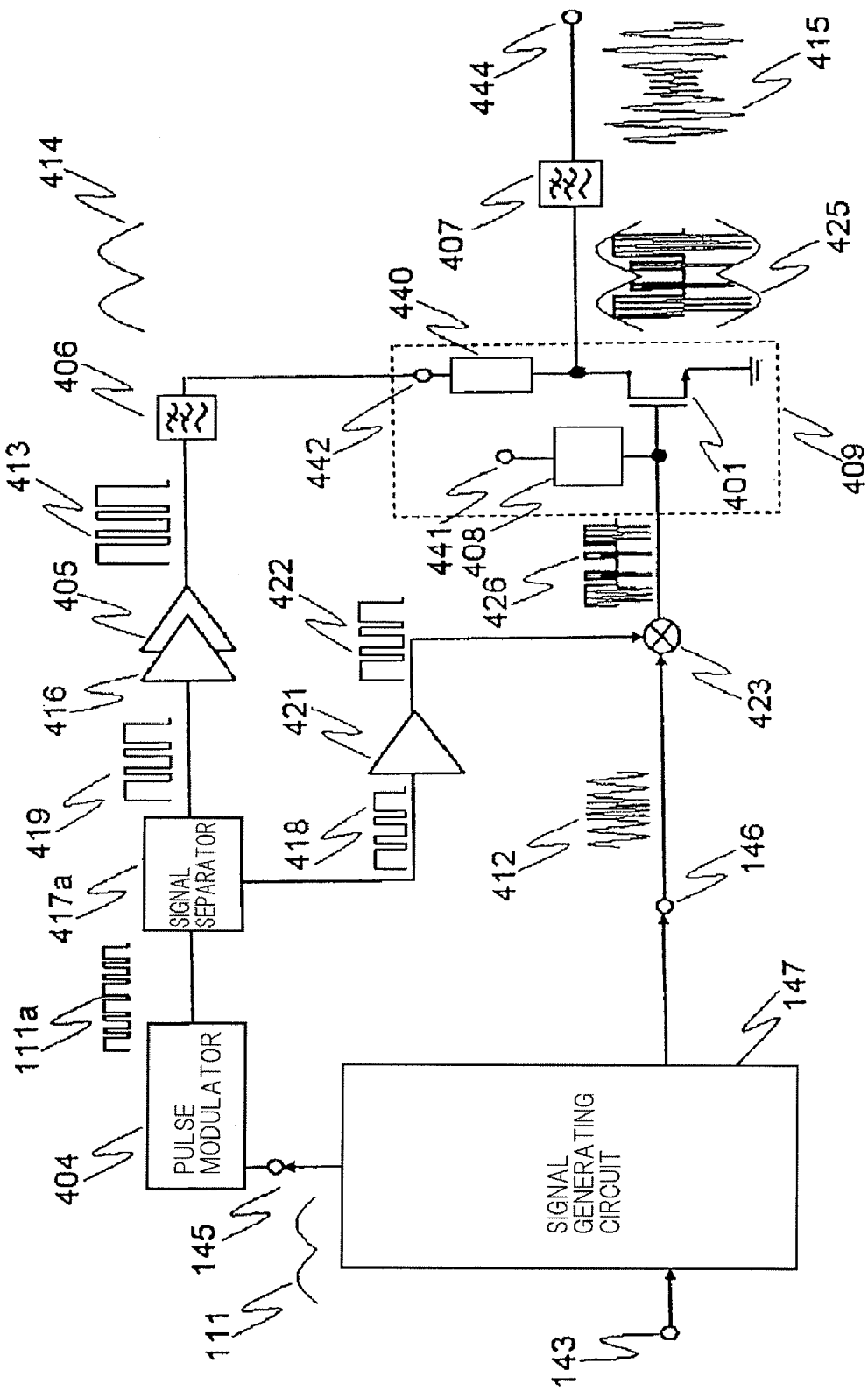
FIG. 28 is a block diagram showing a configuration of a power amplifier according to a third exemplary embodiment.

FIG. 28 is a block diagram showing a configuration of a power amplifier according to the third exemplary embodiment.

As shown in FIG. 28, the power amplifier according to the third exemplary embodiment is different from the power amplifier according to the first exemplary embodiment shown in FIG. 10 as to configurational and operational details of signal generating circuit 447 for generating first control signal 418 and second control signal 419, pulse modulator 404, and signal separator 417a. The configurational and operational details of the other components are the same as those of the power amplifier according to the first exemplary embodiment and will not be described in detail below.

Decomposing circuit 1 shown in FIG. 9 corresponds to signal separator 417a shown in FIG. 28, mixing circuit 2 shown in FIG. 9 to mixer 423 shown in FIG. 28, and RF amplifier 4 shown in FIG. 9 to RF amplifier 409 shown in FIG. 28. Amplifying circuit 3 shown in FIG. 9 is made up of second driver amplifier 416, switching amplifier 405, and low-pass filter 406 shown in FIG. 28.

Figure 2:
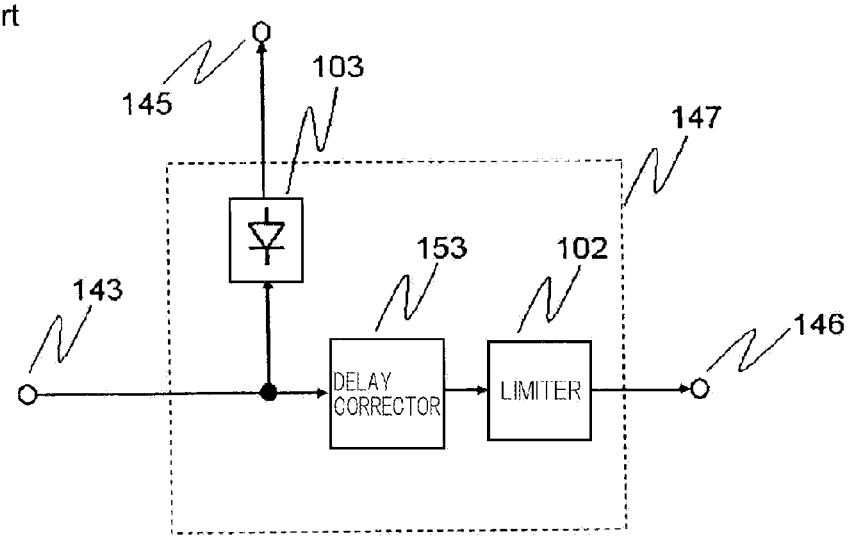
FIG. 2 is a block diagram showing a configurational example of a signal generating circuit shown in FIG. 1.
Figure 3:
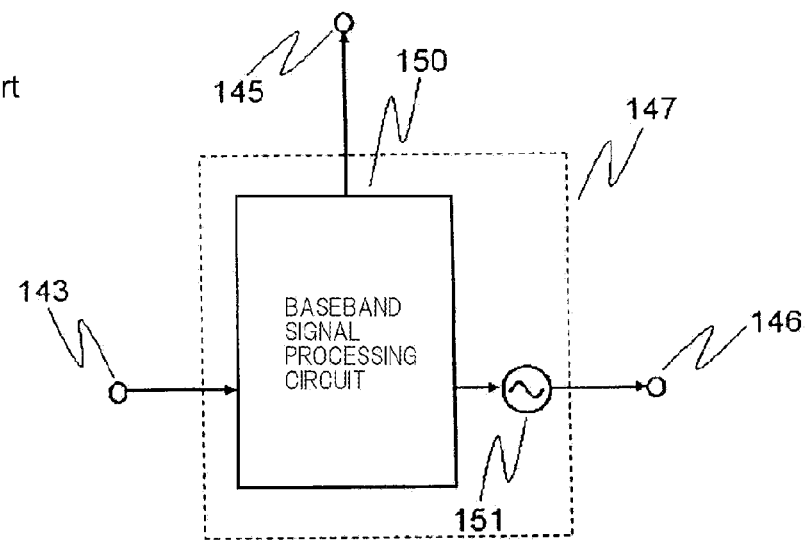
FIG. 3 is a block diagram showing another configurational example of the signal generating circuit shown in FIG. 1.
Figure 4:
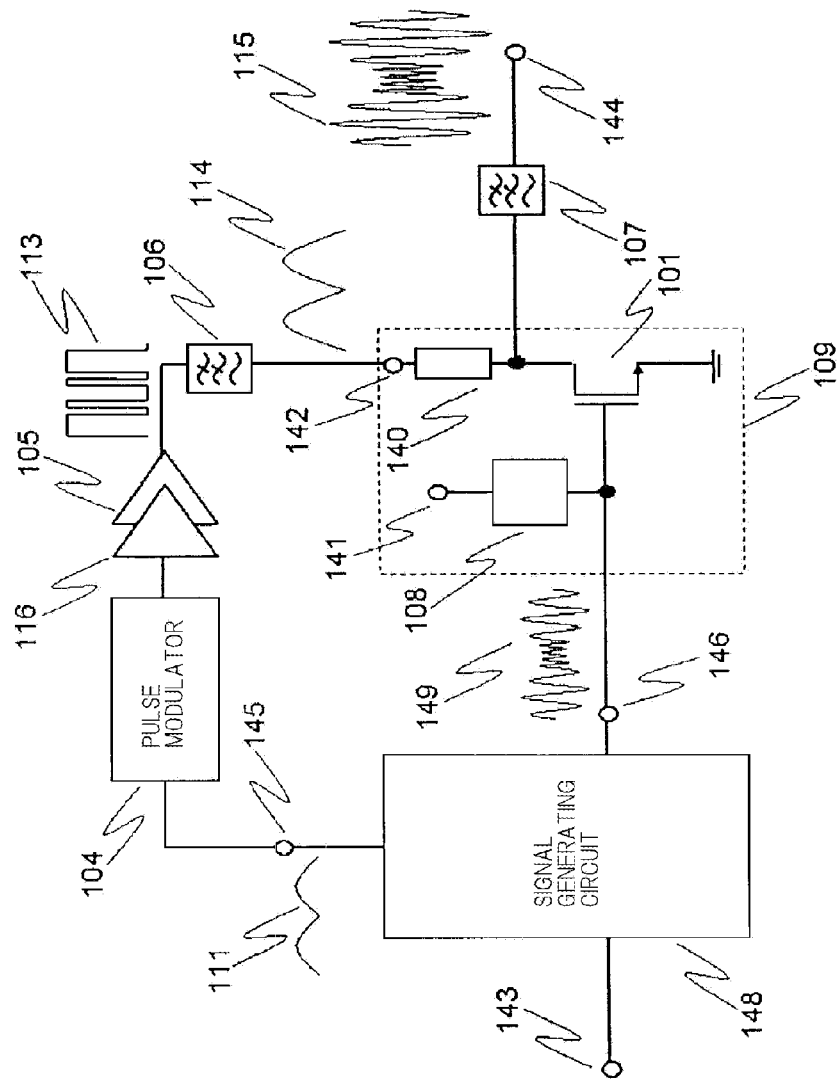
FIG. 4 is a block diagram showing the configuration of a power amplifier according to the background art which is based on ET technology.

Signal generating circuit 147 according to the present exemplary embodiment is of the same configuration as the signal generating circuit according to the background art shown in FIG. 2 or 3, and extracts an AM component included in an input signal and outputs the extracted AM component as amplitude component signal 111 from terminal 145.

Amplitude component signal 111 output from signal generating circuit 147 is converted into a rectangular-wave signal (1-bit pulse signal) 111a having a constant amplitude by pulse modulator 404. 1-bit pulse signal 111a converted by pulse modulator 404 is decomposed into first control signal 418 and second control signal 419 by signal separator 417a.

If it is assumed that the amplitude component of the input signal is represented by a(t) and 1-bit pulse signal 111a by D[a(t)], then signal separator 417a decomposes AM component a(t) of the input signal into 1-bit pulse signals $D[a_1(t)]$, $D[a_2(t)]$ which satisfy the above relationship: a(t) proportional to $a_1(t) a_2(t)$. Signal separator 417a outputs 1-bit pulse signal $D[a_1(t)]$ as first control signal 418 to first driver amplifier 421, and outputs 1-bit pulse signal $D[a_2(t)]$ as second control signal 419 to second driver amplifier 416. Signal separator 417a may comprise a DSP, for example.

In the power amplifier according to the first exemplary embodiment shown in FIG. 10, first control signal 418 and second control signal 419 comprise analog signals. According to the present exemplary embodiment, first control signal 418 and second control signal 419 comprise 1-bit pulse signals, respectively. However, as with the first exemplary embodiment, at least one of decomposed control signals $a_1(t)$, $a_2(t)$ is selected as having a smaller dynamic range than AM component a(t) of the original input signal. Pulse modulator 404 may comprise a PWM (Pulse Width Modulation) modulator, a delta modulator, a delta-sigma modulator, or the like. These modulators may be implemented by an analog circuit comprising an operational amplifier, a switched capacitor circuit, etc. in combination.

First driver amplifier 421 amplifies first control signal 418 output from signal separator 417a and supplies amplified first control signal 418 to mixer 428. If signal separator 417a is capable of outputting a signal which is intensive enough to drive mixer 423, then first driver amplifier 421 may be dispensed with.

Second driver amplifier 416 drives switching amplifier 405 according to the rectangular-wave signal (second control signal 419) output from signal separator 417a, and switching amplifier 405 current-amplifies the rectangular-wave signal efficiently. The amplified rectangular-wave signal is smoothed by low-pass filter 106, and then supplied through terminal 442 to RF amplifier 409. Switching amplifier 405 may comprise an amplifier capable of amplifying the rectangular-wave signal with high power efficiency, e.g., a class-D amplifier, a class-E amplifier, a class-S amplifier, or the like. If signal separator 417a is capable of outputting a signal which is intensive enough to drive switching amplifier 405, then second driver amplifier 416 may be dispensed with.

Mixer 423 mixes phase component signal 412 output from signal generating circuit 447 and the rectangular-wave signal output from first driver amplifier 421 with each other, and outputs the mixed signal to RF amplifier 409.

RF amplifier 409, which comprises transistor 401, input power supply circuit 408, and output power supply circuit 440, amplifies output signal 426 from mixer 423. At this time, the output signal from RF amplifier 409 is amplitude-amplified with the smoothed rectangular-wave signal supplied from switching amplifier 405 through low-pass filter 406 and terminal 442, i.e., amplified second control signal 414. Therefore, RF amplifier 409 outputs signal 425 that is generated by multiplying phase component signal 412 by rectangular-wave signal 422 and multiplying the product by output signal 414 from low-pass filter 406.

As signal 425 output from RF amplifier 409 passes through bandpass filter 407 which has a frequency band that is wider than frequency band 428 of the baseband signal and that is capable of removing spurious components caused by rectangular-wave signal 422, unwanted spurious components added to signal 425 output from RF amplifier 409 are removed, thereby producing desired RF signal 415 which is representative of the linearly amplified input signal.

As described above, the power amplifier according to the third exemplary embodiment reduces the dynamic ranges of first control signal 418 and second control signal 419 so as to be smaller than the dynamic range of AM component a(t) of the original input signal. Therefore, the average output voltage of switching amplifier 405 and the output voltage of RF amplifier 409 are prevented from being lowered, thus preventing the power efficiency of RF amplifier 409 and switching amplifier 405 from being lowered.

Inasmuch as first control signal 418 is converted into the rectangular-wave signal with the constant amplitude and the rectangular-wave signal is input to RF amplifier 409, the information of first control signal 418 is not lost, but is properly reflected in the output signal of RF amplifier 409 even when RF amplifier 409 is saturated state in operation.

The power amplifier according to the present exemplary embodiment thus produces an output signal representative of the waveform of the input signal that is restored more accurately than with the power amplifier according to the background art shown in FIG. 7 which does not reflect a portion of the amplitude component signal and fails to reproduce the signal properly.

With the power amplifier according to the present exemplary embodiment, both the input and output signals of signal separator 417a are 1-bit digital signals. Therefore, signal separator 417a can be implemented by a processing sequence performed by a DSP comprising a combination of a counter, a digital filter, logic operations, etc. Therefore, signal separator 417a is advantageous in that it can flexibly decompose the input signal into control signals $a_1(t)$, $a_2(t)$.

Furthermore, since the power amplifier requires only one pulse modulator which is an analog circuit that requires a relatively large circuit area and that consumes relatively large electric power, the overall size and power consumption of the power amplifier can be reduced.

Each of the first through third modifications of the first exemplary embodiment can also be applied to the power amplifier according to the third exemplary embodiment, and, when applied, provides not only the advantages described with respect to the first exemplary embodiment, but also the advantages described above.

Figure 5:
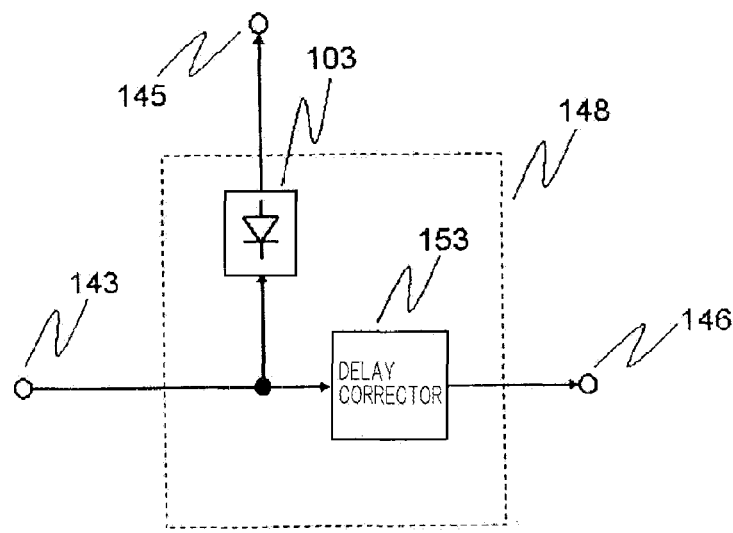
FIG. 5 is a block diagram showing a configurational example of a signal generating circuit shown in FIG. 4.
Figure 6:
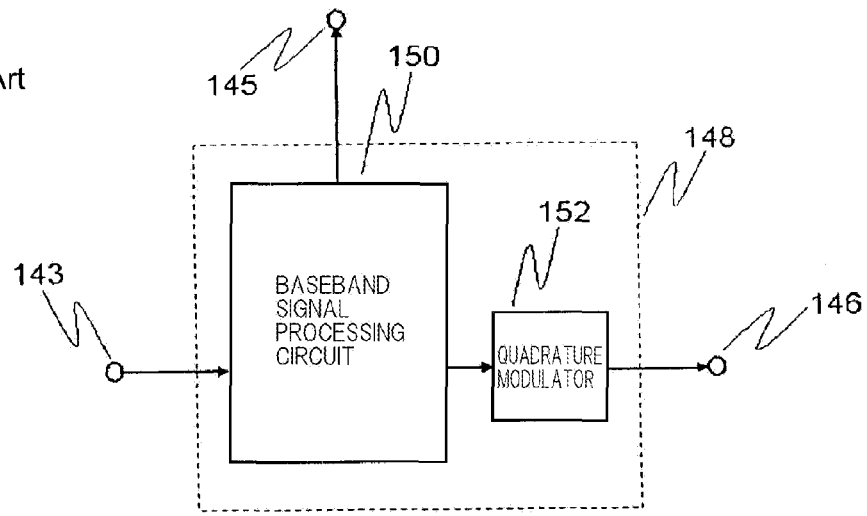
FIG. 6 is a block diagram showing another configurational example of the signal generating circuit shown in FIG. 4.

If the second modification and the third modification (ET technology) of the first exemplary embodiment are applied to the power amplifier according to the third exemplary embodiment, then the signal generating circuit may be of the configuration according to the background art shown in FIG. 5 or 6. Signal generating circuit 148 shown in FIG. 5 is of a configuration that is optimum for an application wherein an RF signal is input to input terminal 143 of the power amplifier, and the signal generating circuit shown in FIG. 6 is of a configuration that is optimum for an application wherein a baseband signal is input to input terminal 143 of the power amplifier.

According to the third exemplary embodiment, as described with respect to the second exemplary embodiment, amplitude component a(t) of the input signal can be decomposed by signal separator 417a into a low-frequency component (second control signal) $D[a_s(t)]$ and a remaining frequency component (first control signal) $D[a_f(t)]$ ($a_f(t)$ proportional to $a(t)/a_s(t)$) produced by removing $a_s(t)$ from a(t).

In this case, since both the input signal and the output signal comprise 1-bit digital signals, signal separator 417a can be implemented by a processing sequence performed by a DSP comprising a combination of a counter, a digital filter, logic operations, etc. Other configurational and operational details are the same as those of the second exemplary embodiment, and will not be described below.

With a configuration which is a combination of the configuration according to the third exemplary embodiment and the configuration according to the second exemplary embodiment, since signal component $a_s(t)$ included in second control signal 419 is of a low frequency, the average switching frequency of second control signal 419 is also low, making it possible to operate second driver amplifier 416 and switching amplifier 405 at a high voltage of several tens of volts. While first control signal 418 has as high a frequency as the AM component of the input signal, the input voltage of RF amplifier 409 may usually be of a relatively low voltage of several volts even when the output electric power is large as is the case where the power amplifier according to the present invention is used in wireless base stations. Consequently, it is possible to operate first driver amplifier 418 at a relatively low voltage and at a desired high frequency.

The combination of the configuration according to the third exemplary embodiment and the configuration according to the second exemplary embodiment is also applicable to apparatuses which require a wide band and high output electric power because, as described above, switching amplifier 405, first driver amplifier 416, and second driver amplifier 421 do not need to have both a high-voltage output and fast switching operation. Moreover, since the power amplifier requires only one pulse modulator which is an analog circuit that requires a relatively large circuit area and which consumes a relatively large amount of electric power, the overall size and power consumption of the power amplifier can be reduced.

Fourth Exemplary Embodiment

A power amplifier according to a fourth exemplary embodiment will be described below with reference to the drawings.

Figure 29:
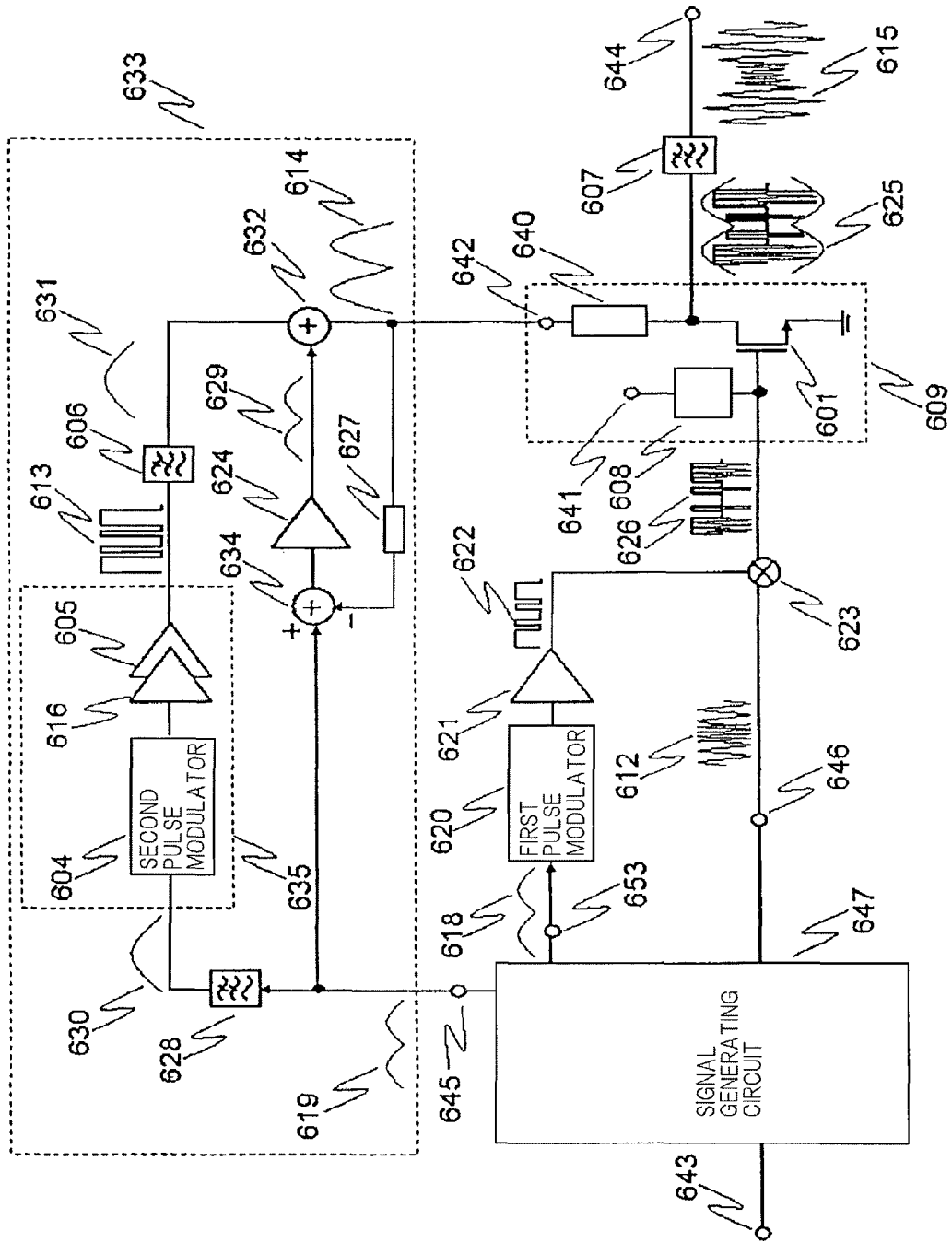
FIG. 29 is a block diagram showing a configuration of a power amplifier according to a fourth exemplary embodiment.

FIG. 29 is a block diagram showing a configuration of a power amplifier according to the fourth exemplary embodiment. FIG. 29 shows a configuration of a power amplifier according to the background art which is based on the EER technology.

As shown in FIG. 29, the power amplifier according to the fourth exemplary embodiment comprises signal generating circuit 647, RF (Radio Frequency) amplifier 609, first pulse modulator 620, first driver amplifier 621, mixer 623, output power supply modulating circuit 633, and band pass filter 607.

Decomposing circuit 1 shown in FIG. 9 is included in signal generating circuit 447 shown in FIG. 29, mixing circuit 2 shown in FIG. 9 corresponds to mixer 423 shown in FIG. 28, RF amplifier 4 shown in FIG. 9 to RF amplifier 609 shown in FIG. 28, and amplifying circuit 3 shown in FIG. 9 to output power supply modulating circuit 633 shown in FIG. 29.

Signal generating circuit 647 extracts an AM component included in an input signal, outputs first control signal 618 generated from the AM component through terminal 653 to first pulse modulator 620, and outputs second control signal 619 generated from the AM component through terminal 645 to output power supply modulating circuit 633.

According to the present exemplary embodiment, if it is assumed that the AM component of the input signal is represented by a(t), then amplitude component $a_e(t)$ which satisfies the relationship: a(t) proportional to $a_d(t)a_e(t)$ is output as first control signal 618 to first pulse modulator 620, and amplitude component $a_d(t)$ which has a higher ratio of a DC component to an AC component than AM component a(t) is output as second control signal 619 to output power supply modulating circuit 633.

Second control signal 619 may be a signal which satisfies the relationship: $a_d(t)$ proportional to sqrt(a(t)). If it is assumed that the input signal is an RF signal according to the W-CDMA (downlink) scheme, then 63% of the electric power of amplitude component a(t) of the input signal is taken up by a DC component. If second control signal 619 comprises amplitude component $a_d(t)$ which satisfies the relationship: $a_d(t)$ proportional to sqrt(a(t)), then the proportion of a DC component in $a_d(t)$ is 86%. At this time, first control signal 618 satisfies $a_e(t)$ proportional to sqrt(a(t)) because of the relationship: a(t) proportional to $a_d(t)a_e(t)$.

Second control signal 619 according to another example may be a signal which is represented by amplitude component a(t) and a DC component added thereto. In this case, first control signal 618 satisfies $a_e(t)$ proportional to $(a(t)/a_d(t))$ because of the relationship: a(t) proportional to $a_d(t)a_e(t)$.

Second control signal 619 is not limited to the above examples, but may be any signal insofar as it has a higher ratio of a DC component to an AC component than AM component a(t).

Signal generating circuit 647 extracts a PM component included in an input signal, and outputs the extracted PM component as phase component signal 612 through terminal 646 to mixer 623. As with the first exemplary embodiment and the second exemplary embodiment, signal generating circuit 647 according to the present exemplary embodiment should desirably have a function to adjust the delay time difference between first control signal 618 and phase component signal 612 and the delay time difference between second control signal 619 and phase component signal 612.

First pulse modulator 620 pulse-modulates first control signal 618 to generate a rectangular-wave signal having a constant amplitude, and outputs the rectangular-wave signal to first driver amplifier 621. First pulse modulator 620 may comprise a PWM (Pulse Width Modulation) modulator, a delta modulator, a delta-sigma modulator, or the like. First pulse modulator 620 may comprise any circuit insofar as it can convert first control signal 618 output from signal generating circuit 647 into a rectangular-wave signal having a constant amplitude.

First driver amplifier 621 amplifies the rectangular-wave signal output from first pulse modulator 620 and supplies the amplified rectangular-wave signal to mixer 623. If first pulse modulator 620 is capable of outputting a signal which is intensive enough to drive mixer 623, then first driver amplifier 621 may be dispensed with.

Output power supply modulating circuit 633 comprises first low-pass filter 628, second pulse modulator 604, second driver amplifier 616, switching amplifier 605, second low-pass filter 606, subtractor 634, attenuator 627, linear amplifier 624, and adder 632.

First low-pass filter 628 passes a low-frequency component of second control signal 619 ($a_d(t)$) output from signal generating circuit 647, and outputs the low-frequency component to second pulse modulator 604.

Second pulse modulator 604 pulse-modulates second control signal 619 (low-frequency component) which has passed through first low-pass filter 628 to generate a rectangular-wave signal, and outputs the rectangular-wave signal to second driver amplifier 616. Second pulse modulator 604 may comprise a PWM (Pulse Width Modulation) modulator, a delta modulator, a delta-sigma modulator, or the like, as with first pulse modulator 620.

Second driver amplifier 616 drives switching amplifier 605 according to the rectangular-wave signal output from second pulse modulator 604, and switching amplifier 605 current-amplifies the rectangular-wave signal efficiently. The amplified rectangular-wave signal is smoothed by second low-pass filter 606, and supplied through adder 632 and terminal 642 to RF amplifier 609. Switching amplifier 605 may comprise an amplifier capable of amplifying the rectangular-wave signal with high power efficiency, e.g., a class-D amplifier, a class-E amplifier, a class-S amplifier, or the like. Switching regulator 635 including second pulse modulator 604, second driver amplifier 616, and switching amplifier 605 may be replaced with a known DC/DC converter. If second pulse modulator 604 is capable of outputting a signal which is intensive enough to drive switching amplifier 605, then second driver amplifier 616 may be dispensed with.

Subtractor 634 subtracts an output signal of adder 634, which is fed-back through attenuator 627, from second control signal 619 ($a_d(t)$) output from signal generating circuit 647, and outputs the subtraction result to linear amplifier 624. Linear amplifier 624 amplifies the output signal from subtractor 634, and outputs the amplified signal to adder 632.

Adder 632 adds signal 631 output from second low-pass filter 606 and signal 629 output from linear amplifier 624, and outputs the sum to RF amplifier 609.

According to the present exemplary embodiment, second control signal 619 ($a_d(t)$) output from signal generating circuit 647 is processed into corrective signal 629 for correcting a relatively high-frequency component by linear amplifier 624 having a feedback circuit, and corrective signal 629 is added to output signal 631 from second low-pass filter 606 by adder 632, thereby producing signal 614 which represents first control signal 619 that is amplified with accuracy. The output signal from RF amplifier 609 is amplitude-modulated with signal 614.

Mixer 623 mixes phase component signal 612 output from signal generating circuit 647 with the rectangular-wave signal output from first driver amplifier 621, and outputs the mixed signal to RF amplifier 409.

RF amplifier 609, which comprises transistor 601, input power supply circuit 608, and output power supply circuit 640, amplifies output signal 626 from mixer 623. At this time, the output signal from RF amplifier 609 is amplitude-amplified with the corrected rectangular signal supplied from output power supply modulating circuit 633, i.e., amplified amplitude component signal 614. Input power supply circuit 608 that is connected to the gate of transistor 601 is supplied with a constant DC voltage from a power supply device, not shown, through terminal 641, as with the background art. Transistor 601 may be either a field-effect transistor or a bipolar transistor.

The signal amplified by RF amplifier 609 (output signal 625) is processed by bandpass filter 607 to remove unwanted band components therefrom, and then supplied through terminal 644 to an antenna device, not shown, or the like.

Signal generating circuit 647 shown in FIG. 29 may be of the same configuration as the second exemplary embodiment shown in FIGS. 26 and 27, etc. or may be of a configuration including the baseband signal processing circuit shown in FIGS. 14 and 24, for example. Terminals 443, 445, 446, 453 shown in FIGS. 14 and 24 and FIGS. 26 and 27 correspond to terminals 643, 645, 646, 653 shown in FIG. 29. The configurational and operational details of signal generating circuit 647 are the same as the configurational and operational details described with respect to the first exemplary embodiment and the second exemplary embodiment, and will not be described below.

In FIG. 29, signal generating circuit 647 includes a D/A converter for outputting first control signal 618 and second control signal 619 as analog signals. However, if signal generating circuit 647 includes the signal separator comprising a DSP shown in FIG. 13 or the baseband signal processing circuit shown in FIG. 14, then signal generating circuit 647 may output first control signal 618 and second control signal 619 as digital signals. In this case, first pulse modulator 620 and output power supply modulating circuit 633 may include respective D/A converters. The baseband signal processing circuit and the signal separator of signal generating circuit 647 may include the functions of first pulse modulator 620 and output power supply modulating circuit 633. In this case, first pulse modulator 620 and output power supply modulating circuit 633 may be dispensed with.

In the power amplifier shown in FIG. 29, first control signal 622 is added to phase component signal 612 by mixer 623. This function can also be realized by RF amplifier 478 shown in FIG. 15, as with the first exemplary embodiment.

If RF amplifier 478 shown in FIG. 15 is used in place of mixer 623, then phase component signal 612 may be input from terminal 476 shown in FIG. 15, and the rectangular-wave signal output from first driver amplifier 621 may be input to input power supply terminal 474 or output power supply terminal 475.

Since RF amplifier 609 shown in FIG. 29 provides high power efficiency when saturated state in operation, the input signal applied to RF amplifier 609 should desirably have electric power high enough to saturate state RF amplifier 609 in operation. However, when RF amplifier 609 is saturated state in operation, the output signal of RF amplifier 609 does not reflect the amplitude component of the input signal of RF amplifier 609. Accordingly, first control signal 618 is converted into rectangular-wave signal 622 having a constant amplitude, and rectangular-wave signal 622 is added to phase component signal 612 by mixer 623 and then input to RF amplifier 609. By thus processing first control signal 618, it is possible for the output signal of RF amplifier 609 to reflect the amplitude component of first control signal 618.

With the power amplifier according to the present exemplary embodiment, furthermore, the drain of transistor 601 of RF amplifier 609 is supplied with amplitude component signal 614 through terminal 642 and output power supply circuit 640 to amplitude-modulate the signal amplified by transistor 601 with amplitude component signal 614. The amplitude modulation causes RF amplifier 609 to output signal 625 that is generated by multiplying phase component signal 612 by rectangular-wave signal 622 and by multiplying the product by output signal (output power supply modulation signal) 614 from second low-pass filter 606.

According to the present exemplary embodiment, inasmuch as amplitude component $a_d(t)$ which satisfies the relationship: $a(t)$ proportional to $a_d(t)a_e(t)$ and which has a higher ratio of a DC component to an AC component than AM component $a(t)$ is supplied as second control signal 619 to output power supply modulating circuit 633, the amplitude of corrective signal 629 output from linear amplifier 624 is reduced. Therefore, the power amplifier can reduce the power consumption of the linear amplifier in addition to providing the advantages of the first exemplary embodiment and the second exemplary embodiment. Since the linear amplifier can have a low operating voltage, the linear amplifier can have a low cost.

Figure 30:
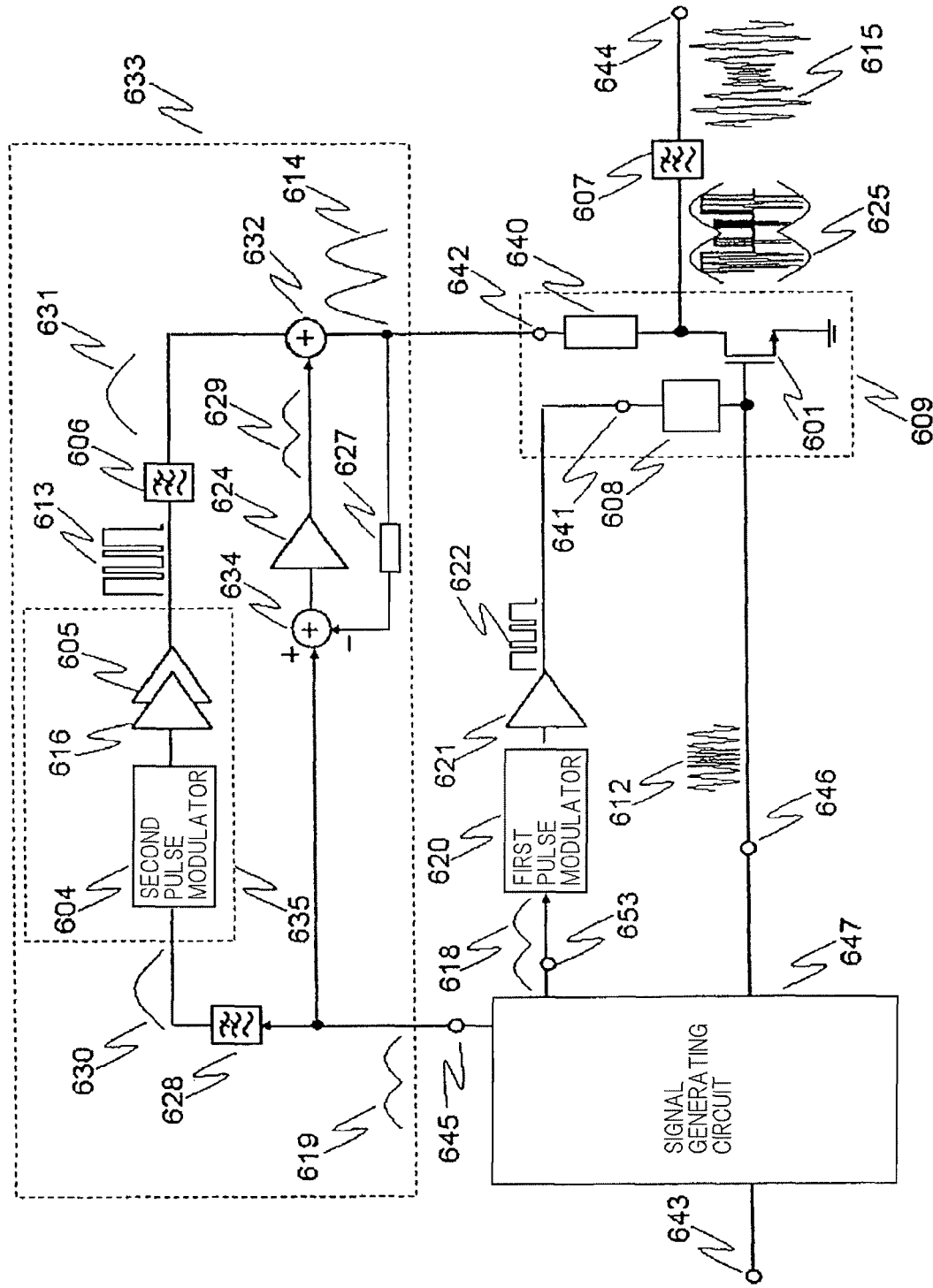
FIG. 30 is a block diagram showing a configuration of a first modification of the power amplifier according to the fourth exemplary embodiment.
Figure 31:
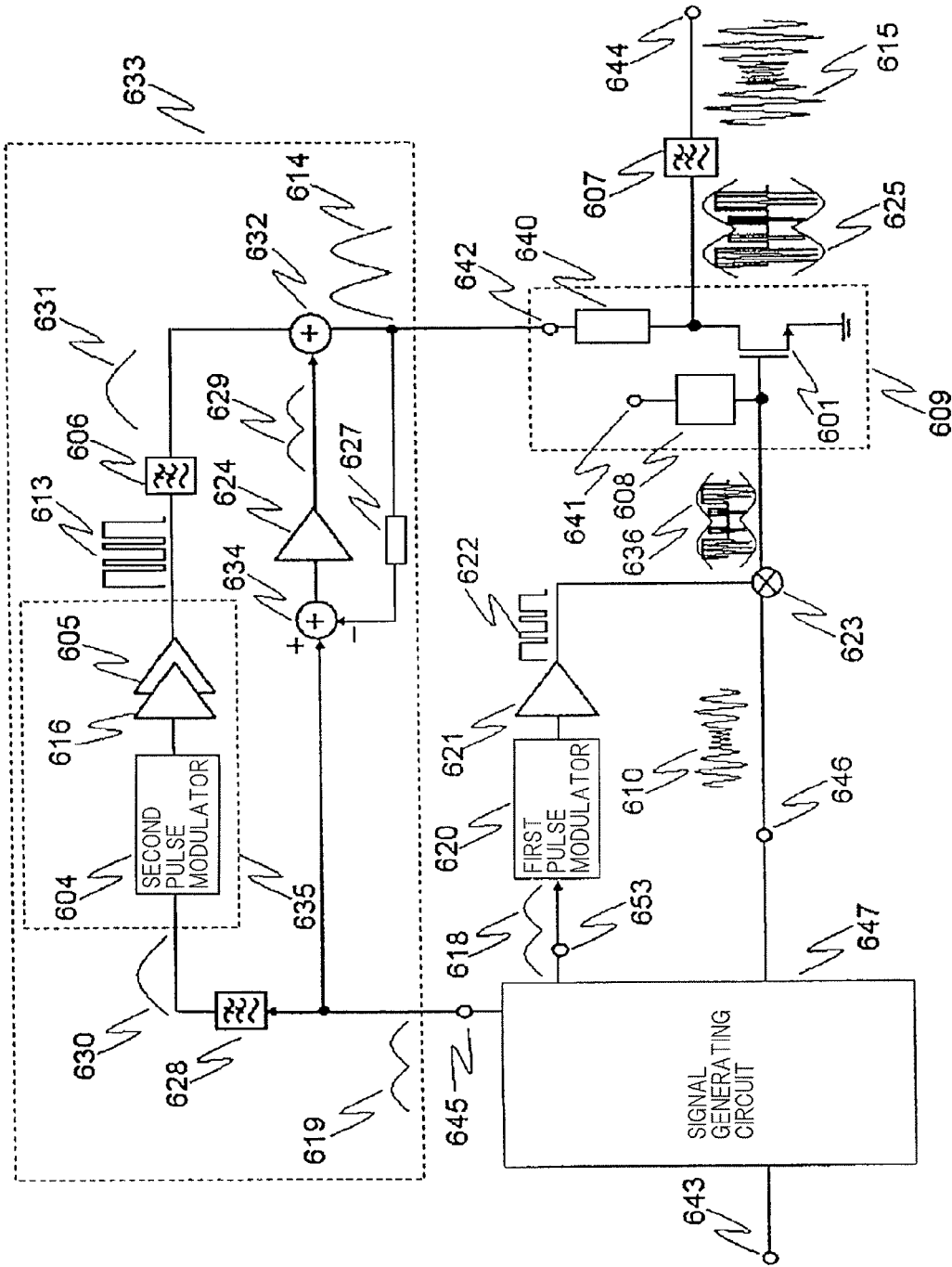
FIG. 31 is a block diagram showing a configuration of a second modification of the power amplifier according to the fourth exemplary embodiment.
Figure 32:
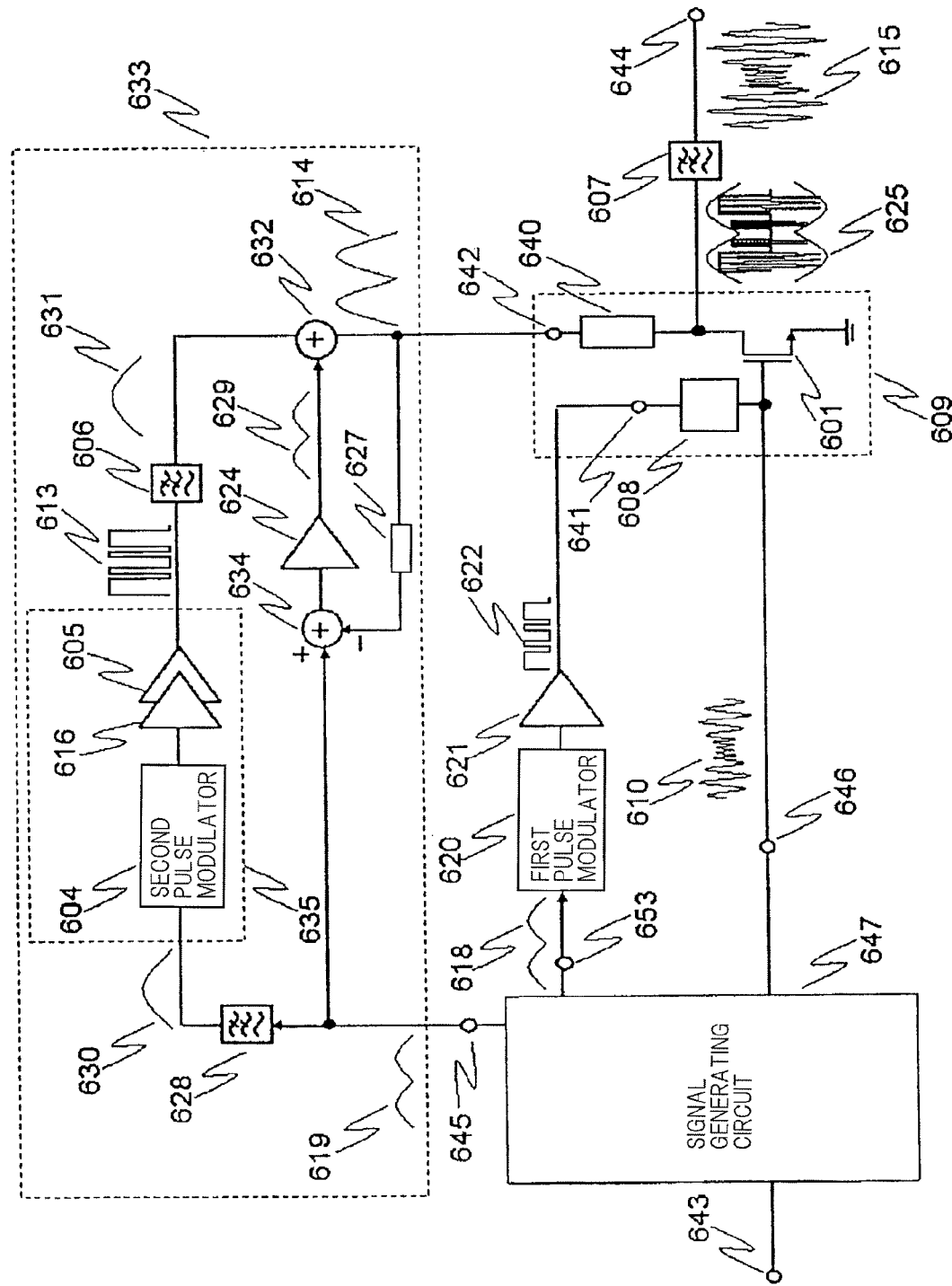
FIG. 32 is a block diagram showing a configuration of a third modification of the power amplifier according to the fourth exemplary embodiment.

FIG. 30 is a block diagram showing a configuration of a first modification of the power amplifier according to the fourth exemplary embodiment, FIG. 31 is a block diagram showing a configuration of a second modification of the power amplifier according to the fourth exemplary embodiment, and FIG. 32 is a block diagram showing a configuration of a third modification of the power amplifier according to the fourth exemplary embodiment.

Each of the first through third modifications of the first exemplary embodiment can also be applied to the power amplifier according to the fourth exemplary embodiment, and, when applied, provides not only the advantages described with respect to the first exemplary embodiment, but also the advantages described above.

If the second modification and the third modification (ET technology) of the first exemplary embodiment are applied to the power amplifier according to the fourth exemplary embodiment, then signal generating circuit 647 may be of the configuration shown in FIG. 27 or the configuration shown in FIG. 24. Signal generating circuit 447 shown in FIG. 27 is of a configuration that is optimum for an application wherein an RF signal is input to the power amplifier according to the present exemplary embodiment.

This application is based upon and claims the benefit of priority from No. 2006-349724 filed on Dec. 26, 2006 and Japanese patent application No. 2007-310899 filed on Nov. 30, 2007, the disclosure of which is incorporated herein in its entirety by reference.

The invention claimed is:

1. A power amplifier for amplifying a modulated signal including an amplitude-modulated component and a phase-modulated component, comprising:
   a decomposing circuit for decomposing said amplitude-modulated component into two control signals;
   a mixing circuit for mixing one of the decomposed control signals with said phase-modulated component;
   an amplifying circuit for amplifying the other of the decomposed control signals;
   an RF amplifier for amplifying a signal output from said mixing circuit, amplitude-modulating the amplified signal with an output signal from said amplifying circuit, and outputting the amplitude-modulated signal;
   a signal generating circuit for extracting said amplitude-modulated component of said modulated signal and extracting and outputting the phase-modulated component of said modulated signal, said signal generating circuit including said decomposing circuit; and
   a first pulse modulator for pulse-modulating one of the decomposed control signals;
   wherein said mixing circuit comprises a mixer for mixing said phase-modulated component extracted by said signal generating circuit and a rectangular-wave signal output from said first pulse modulator, with each other;
   said amplifying circuit comprises a second pulse modulator for pulse-modulating the other of the decomposed control signals, a switching amplifier for current-amplifying a rectangular-wave signal output from said second pulse modulator, and a low-pass filter for smoothing an output signal from said switching amplifier; and
   said RF amplifier amplifies an output signal from said mixer, amplitude-modulates the amplified signal with an output signal from said low-pass filter, and outputs the amplitude-modulated signal.

2. The power amplifier according to claim 1, further comprising:
   a bandpass filter for allowing an output signal from said RF amplifier therethrough to pass through, said bandpass filter having a passband for allowing said modulated signal to pass through and removing spurious components caused by a rectangular-wave signal output from said switching amplifier.

3. The power amplifier according to claim 1, wherein at least one of said two control signals has a smaller dynamic range than the amplitude-modulated component of said modulated signal.

4. The power amplifier according to claim 3, wherein either one of said two control signals is given as a root of the amplitude-modulated component of said modulated signal.

5. The power amplifier according to claim 3, wherein either one of said two control signals comprises a signal proportional to the amplitude-modulated component of said modulated signal when the amplitude-modulated component of said modulated signal is equal to or greater than a preset threshold value, and a signal having a constant value when the amplitude-modulated component of said modulated signal is smaller than said preset threshold value.

6. The power amplifier according to claim 3, wherein either one of said two control signals comprises a signal having a constant value when the amplitude-modulated component of said modulated signal is equal to or greater than a preset threshold value, and a signal proportional to the amplitude-modulated component of said modulated signal when the amplitude-modulated component of said modulated signal is smaller than said preset threshold value.

7. The power amplifier according to claim 6, wherein said signal generating circuit outputs a signal produced by passing the amplitude-modulated component of said modulated signal through the low-pass filter, as one of the control signals which has a smaller band than the amplitude-modulated component of said modulated signal, and outputs a signal, having a value produced by dividing the amplitude-modulated component of said modulated signal by an amplitude component of said one of the control signals, as the other of the control signals.

8. The power amplifier according to claim 1, wherein at least one of said two control signals has a smaller dynamic range than the amplitude-modulated component of said modulated signal, and the control signal whose dynamic range is smaller than the amplitude-modulated component of said modulated signal is supplied to said second pulse modulator.

9. The power amplifier according to claim 1, wherein either one of said two control signals comprises a signal having a higher ratio of a DC component to an AC component than the amplitude-modulated component of said modulated signal.

10. The power amplifier according to claim 9, further comprising:
a linear amplifier for amplifying the control signal having the higher ratio of the DC component to the AC component than the amplitude-modulated component of said modulated signal, using as a feedback signal a signal for amplitude-modulating the output signal from said RF amplifier; and
an adder for adding the output signal from said low-pass filter and an output signal from said linear amplifier to each other, and outputting the sum as the signal for amplitude-modulating the output signal from said RF amplifier, to the RF amplifier.

11. The power amplifier according to claim 9, wherein one of said two control signals which has the higher ratio of the DC component to the AC component than the amplitude-modulated component of said modulated signal is supplied to said second pulse modulator.

12. The power amplifier according to claim 9, wherein either one of said two control signals is given as a root of the amplitude-modulated component of said modulated signal.

13. The power amplifier according to claim 1, wherein at least one of said two control signals has a smaller signal band than the amplitude-modulated component of said modulated signal.

14. A power amplifier for amplifying a modulated signal including an amplitude-modulated component and a phase-modulated component, comprising:
a decomposing circuit for decomposing said amplitude-modulated component into two control signals;
a mixing circuit for mixing one of the decomposed control signals with said phase-modulated component;
an amplifying circuit for amplifying the other of the decomposed control signals;
an RF amplifier for amplifying a signal output from said mixing circuit, amplitude-modulating the amplified signal with an output signal from said amplifying circuit, and outputting the amplitude-modulated signal;
a signal generating circuit for extracting said amplitude-modulated component of said modulated signal and extracting and outputting the phase-modulated component of said modulated signal, said signal generating circuit including said decomposing circuit; and
a first pulse modulator for pulse-modulating one of the decomposed control signals;
wherein said amplifying circuit comprises a second pulse modulator for pulse-modulating the other of the decomposed control signals, a switching amplifier for current-amplifying a rectangular-wave signal output from said second pulse modulator, and a low-pass filter for smoothing an output signal from said switching amplifier; and
said RF amplifier includes said mixing circuit for mixing said phase-modulated component extracted by said signal generating circuit and a rectangular-wave signal output from said first pulse modulator, with each other, amplifies a mixed signal, amplitude-modulates the amplified signal with an output signal from said low-pass filter, and outputs the amplitude-modulated signal.

15. A power amplifier for amplifying a modulated signal including an amplitude-modulated component and a phase-modulated component, comprising:
a decomposing circuit for decomposing said amplitude-modulated component into two control signals;
a mixing circuit for mixing one of the decomposed control signals with said phase-modulated component;
an amplifying circuit for amplifying the other of the decomposed control signals;
an RF amplifier for amplifying a signal output from said mixing circuit, amplitude-modulating the amplified signal with an output signal from said amplifying circuit, and outputting the amplitude-modulated signal;
a signal generating circuit for extracting and outputting said amplitude-modulated component and said phase-modulated component of said modulated signal; and
a pulse modulator for pulse-modulating said amplitude-modulated component extracted by said signal generating circuit;
wherein said decomposing circuit comprises a signal separator for decomposing a pulse-modulated signal output from said pulse modulator into two rectangular-wave control signals, the product of signal components thereof from which rectangular components have been removed being proportional to said amplitude-modulated component, and outputting the decomposed control signals;
said mixing circuit comprises a mixer for mixing one of the decomposed control signals and said phase-modulated component extracted by said signal generating circuit, with each other;
said amplifying circuit comprises a switching amplifier for current-amplifying the other of the decomposed control signals said second amplitude component, and a low-pass filter for smoothing an output signal from said switching amplifier; and
said RF amplifier amplifies an output signal from said mixer, amplitude-modulates the amplified signal with an output signal from said low-pass filter, and outputs the amplitude-modulated signal.

16. A power amplifier for amplifying a modulated signal including an amplitude-modulated component and a phase-modulated component, comprising:
a decomposing circuit for decomposing said amplitude-modulated component into two control signals;
a mixing circuit for mixing one of the decomposed control signals with said phase-modulated component;
an amplifying circuit for amplifying the other of the decomposed control signals;
an RF amplifier for amplifying a signal output from said mixing circuit, amplitude-modulating the amplified signal with an output signal from said amplifying circuit, and outputting the amplitude-modulated signal;
a signal generating circuit for extracting and outputting said amplitude-modulated component and said phase-modulated component of said modulated signal; and
a pulse modulator for pulse-modulating said amplitude-modulated component extracted by said signal generating circuit;
wherein said decomposing circuit comprises a signal separator for decomposing a pulse-modulated signal output from said pulse modulator into two rectangular-wave control signals, the product of signal components thereof from which rectangular components have been removed being proportional to said amplitude-modulated component, and outputting the decomposed control signals;
said amplifying circuit comprises a switching amplifier for current-amplifying the other of the decomposed control signals, and a low-pass filter for smoothing an output signal from said switching amplifier; and said RF amplifier includes the mixing circuit for mixing said phase-modulated component extracted by said signal generating circuit and one of the decomposed control signals, with each other, amplifies a mixed signal, amplitude-modulates the amplified signal with an output signal from said low-pass filter, and outputs the amplitude-modulated signal.

17. A power amplifier for amplifying a modulated signal including an amplitude-modulated component and a phase-modulated component, comprising:

a decomposing circuit for decomposing said amplitude-modulated component into two control signals;

a mixing circuit for mixing one of the decomposed control signals with said modulated signal;

an amplifying circuit for amplifying the other of the decomposed control signals;

an RF amplifier for amplifying a signal output from said mixing circuit, amplitude-modulating the amplified signal with an output signal from said amplifying circuit, and outputting the amplitude-modulated signal;

a signal generating circuit for extracting said amplitude-modulated component of said modulated signal, said signal generating circuit including said decomposing circuit; and a first pulse modulator for pulse-modulating one of the decomposed control signals;

wherein said mixing circuit comprises a mixer for mixing said modulated signal and a rectangular-wave signal output from said first pulse modulator;

said amplifying circuit comprises a second pulse modulator for pulse-modulating the other of the decomposed control signals, a switching amplifier for current-amplifying a rectangular-wave signal output from said second pulse modulator, and a low-pass filter for smoothing an output signal from said switching amplifier; and said RF amplifier amplifies an output signal from said mixer, amplitude-modulates the amplified signal with an output signal from said low-pass filter, and outputs the amplitude-modulated signal.

18. The power amplifier according to claim 17, further comprising:

a bandpass filter for allowing an output signal from said RF amplifier therethrough to pass through, said bandpass filter having a passband for allowing said modulated signal to pass through and removing spurious components caused by a rectangular-wave signal output from said switching amplifier.

19. A power amplifier for amplifying a modulated signal including an amplitude-modulated component and a phase-modulated component, comprising:

a decomposing circuit for decomposing said amplitude-modulated component into two control signals;

a mixing circuit for mixing one of the decomposed control signals with said modulated signal;

an amplifying circuit for amplifying the other of the decomposed control signals;

an RF amplifier for amplifying a signal output from said mixing circuit, amplitude-modulating the amplified signal with an output signal from said amplifying circuit, and outputting the amplitude-modulated signal;

a signal generating circuit for extracting said amplitude-modulated component of said modulated signal, said signal generating circuit including said decomposing circuit; and a first pulse modulator for pulse-modulating one of the decomposed control signals;

wherein said amplifying circuit comprises a second pulse modulator for pulse-modulating the other of the decomposed control signals, a switching amplifier for current-amplifying a rectangular-wave signal output from said second pulse modulator, and a low-pass filter for smoothing an output signal from said switching amplifier; and said RF amplifier includes said mixing circuit for mixing said modulated signal and a rectangular-wave signal output from said first pulse modulator, with each other, amplifies a mixed signal, amplitude-modulates the amplified signal with an output signal from said low-pass filter, and outputs the amplitude-modulated signal.

20. A power amplifier for amplifying a modulated signal including an amplitude-modulated component and a phase-modulated component, comprising:

a decomposing circuit for decomposing said amplitude-modulated component into two control signals;

a mixing circuit for mixing one of the decomposed control signals with said modulated signal;

an amplifying circuit for amplifying the other of the decomposed control signals;

an RF amplifier for amplifying a signal output from said mixing circuit, amplitude-modulating the amplified signal with an output signal from said amplifying circuit, and outputting the amplitude-modulated signal;

a signal generating circuit for extracting said amplitude-modulated component of said modulated signal; and a pulse modulator for pulse-modulating said amplitude-modulated component extracted by said signal generating circuit;

wherein said decomposing circuit comprises a signal separator for decomposing a pulse-modulated signal output from said pulse modulator into two rectangular-wave control signals, the product of signal components thereof from which rectangular components have been removed being proportional to said amplitude-modulated component, and outputting the decomposed control signals;

said mixing circuit comprises a mixer for mixing one of the decomposed control signals and said modulated signal with each other;

said amplifying circuit comprises a switching amplifier for current-amplifying the other of the decomposed control signals, and a low-pass filter for smoothing an output signal from said switching amplifier; and said RF amplifier amplifies an output signal from said mixer, amplitude-modulates the amplified signal with an output signal from said low-pass filter, and outputs the amplitude-modulated signal.

21. A power amplifier for amplifying a modulated signal including an amplitude-modulated component and a phase-modulated component, comprising:

a decomposing circuit for decomposing said amplitude-modulated component into two control signals;

a mixing circuit for mixing one of the decomposed control signals with said phase-modulated component;

an amplifying circuit for amplifying the other of the decomposed control signals;

an RF amplifier for amplifying a signal output from said mixing circuit, amplitude-modulating the amplified signal with an output signal from said amplifying circuit, and outputting the amplitude-modulated signal;

a signal generating circuit for extracting said amplitude-modulated component of said modulated signal; and a pulse modulator for pulse-modulating said amplitude-modulated component extracted by said signal generating circuit;

wherein said decomposing circuit comprises a signal separator for decomposing a pulse-modulated signal output from said pulse modulator into two rectangular-wave control signals, the product of signal components thereof from which rectangular components have been removed being proportional to said amplitude-modulated component, and outputting the decomposed control signals;

said amplifying circuit comprises a switching amplifier for current-amplifying the other of the decomposed control signals, and a low-pass filter for smoothing an output signal from said switching amplifier; and said RF amplifier includes the mixing circuit for mixing said modulated signal and one of the decomposed control signals with each other, amplifies a mixed signal, amplitude-modulates the amplified signal with an output signal from said low-pass filter, and outputs the amplitude-modulated signal.

* * * * *